US 6,615,148 B2

(12) United States Patent
Pickerd

(10) Patent No.: US 6,615,148 B2
(45) Date of Patent: Sep. 2, 2003

(54) STREAMING DISTRIBUTED TEST AND MEASUREMENT INSTRUMENT

(75) Inventor: John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 4 days.

(21) Appl. No.: 09/828,661

(22) Filed: Apr. 5, 2001

(65) Prior Publication Data

US 2002/0147554 A1 Oct. 10, 2002

Related U.S. Application Data

(60) Provisional application No. 60/205,794, filed on May 17, 2000.

(51) Int. Cl.[7] .................................................. G01R 13/00
(52) U.S. Cl. ..................................... 702/66; 702/125
(58) Field of Search .................................... 702/66, 125

(56) References Cited

U.S. PATENT DOCUMENTS

| | | | | |
|---|---|---|---|---|
| 4,743,844 A | * | 5/1988 | Odenheimer et al. | 324/115 |
| 4,802,098 A | * | 1/1989 | Hansen et al. | 315/367 |
| 5,870,668 A | * | 2/1999 | Takano et al. | 455/126 |
| 5,949,238 A | * | 9/1999 | Marquis | 324/754 |
| 5,978,742 A | * | 11/1999 | Pickerd | 324/121 R |

* cited by examiner

Primary Examiner—John Barlow
Assistant Examiner—Anthony T. Dougherty
(74) Attorney, Agent, or Firm—Thomas F. Lenihan

(57) ABSTRACT

A "Streaming Distributed Oscilloscope" (SDO) architecture comprises at least one channel including a preamplifier module, a Digitizer Module, and an Acquisition Memory Module. An SDO couples all acquired samples of a waveform being monitored to all of its processing boards. Because multiple processor boards can access all of the sample data, an SDO can perform measurements on substantially all samples of a continuous data stream without dead time. An SDO is readily expandable in terms of memory length by simply adding more memory boards, and can be reconfigured by a user by virtue of its object-oriented architecture. An SDO waveform is defined by a trigger source and an acquisition memory. An SDO is capable of acquiring multiple waveforms based upon different triggers from the same data stream in the same channel. An SDO timebase for a given channel is defined by a decimator followed by an acquisition memory. Multiple timebases can co-exist in the same SDO channel.

16 Claims, 14 Drawing Sheets

| SDO DEFINE WAVEFORMS... TRIGGER RECEIVERS | | | | |
|---|---|---|---|---|
| FILE EDIT VIEW APPLICATIONS TRIGGERS OPTIONS HELP | | | | |
| WFM ID | WFM LABEL | TRIGGER ASSIGNMENTS | | COMMENTS |
| | | CHANNEL SEND | CHANNEL REC. | |
| W1 | RF | CH (1-1) P2 T1 | CH (1-1) M1 T1 | |
| W2 | DEMOD | CH (1-1) P2 T1 | CH (1-1) M2 T1 | |
| W3-1 | SERVO ERR | CH (1-1) P2 T1 | CH (2-1) M1 T1 | |
| W3-2 | | CH (2-2) M1 T2 | CH (2-1) M2 T1 | |
| W3-3 | | CH (2-3) M1 T3 | CH (2-1) M3 T1 | |
| W3-4 | | CH (2-4) M2 T1 | CH (2-1) M4 T1 | |
| W3-5 | | CH (2-5) M2 T2 | CH (2-1) M5 T1 | |

Fig. 8

STREAMING DISTRIBUTED TEST AND MEASUREMENT INSTRUMENT

CLAIM FOR PRIORITY

The subject patent application claims priority from U.S. Provisional Patent Application Serial No. 60/205,794 (Pickerd), filed May 17, 2000.

FIELD OF THE INVENTION

The subject invention generally concerns the field of test and measurement instruments, such as digital oscilloscopes and the like, and in particular concerns a novel architecture for digital test and measurement instruments, such as oscilloscopes, or the like.

BACKGROUND OF THE INVENTION

Modern digital oscilloscopes are generally referred-to as Digital Storage Oscilloscopes (DSOs) or Digital Phosphor Oscilloscopes (DPOs). In either of these types of oscilloscopes, a main feature of the architecture is the use of an A/D (Analog-to-Digital) converter for converting the analog signal under test to a high speed series of digital samples, a demultiplexer for routing the samples to memory, and a circular acquisition memory array for storing the samples. A system microprocessor is used to read the waveform samples from the acquisition memory, and process them for display.

While these oscilloscopes have worked reasonably well up until now, it is herein recognized that there are disadvantages in such an arrangement. One such disadvantage is that prior acquisition memory design described above tends to be relatively expensive in terms of engineering costs, and is difficult to expand. For example, the demultiplexer (demux) IC must be capable of reducing the high Data Input Rate to a slower Write Rate compatible with the operational limits of current memory chips. Furthermore, the maximum possible memory length is limited by the number of address lines on the demux chip.

A second disadvantage lies in the way that prior oscilloscopes handle the data acquisition. That is, data is written into the data acquisition memory in a circular (over-writing) manner until a trigger is detected. Thereafter, in response to the detection of a post-trigger event, the writing process is halted until an external processor reads the waveform data from the acquisition memory. After the data are read-out, the acquisition memory may once again be armed to receive and react to the next trigger event. Specifically, this disadvantage lies in the fact that there is a very large amount of system software overhead (i.e., processing time) resulting from the reading-out and processing of the waveform samples for display. Depending upon the particular algorithms needed to process the waveform samples, a large amount of "dead time" could result during which anomalies in the waveform under test might go undetected.

A third disadvantage of prior art digital oscilloscopes is that the memory length is not readily expandable. Some amount of memory expansion may be provided for, but such memory expansion is limited by the amount of available space for memory ICs on the acquisition board and, as noted above, by the memory addressing capability of the demux ICs. Thus, extensive expansion of acquisition memory is not possible without significant engineering development efforts.

What is needed is a new oscilloscope architecture that would reduce the dead time and increase the probability of detecting such anomalies, and that would be easily expandable in terms of memory length.

SUMMARY OF THE INVENTION

A "Streaming Distributed Oscilloscope architecture" (SDO) comprises at least one channel including a preamplifier module, a Digitizer Module, and an Acquisition Memory Module. An SDO couples all acquired samples of a waveform being monitored to all of its processing boards. Because multiple processor boards can access all of the sample data, an SDO can perform measurements on substantially all samples of a continuous data stream without dead time. An SDO is readily expandable in terms of memory length by simply adding more memory boards, and can be reconfigured by a user by virtue of its object-oriented architecture. An SDO waveform is defined by a trigger source and an acquisition memory. An SDO is capable of acquiring multiple waveforms based upon different triggers from the same data stream in the same channel. An SDO timebase for a given channel is defined by a decimator followed by an acquisition memory. Multiple timebases can co-exist in the same SDO channel.

BRIEF DESCRIPTION OF THE DRAWING

FIG. 8 is an illustration of a screen display according to the subject invention.

DETAILED DESCRIPTION OF THE DRAWING

While the subject invention is described in the environment of an oscilloscope, one skilled in the art will realize that the invention may also be applied to other test and measurement instruments.

Figure 1:
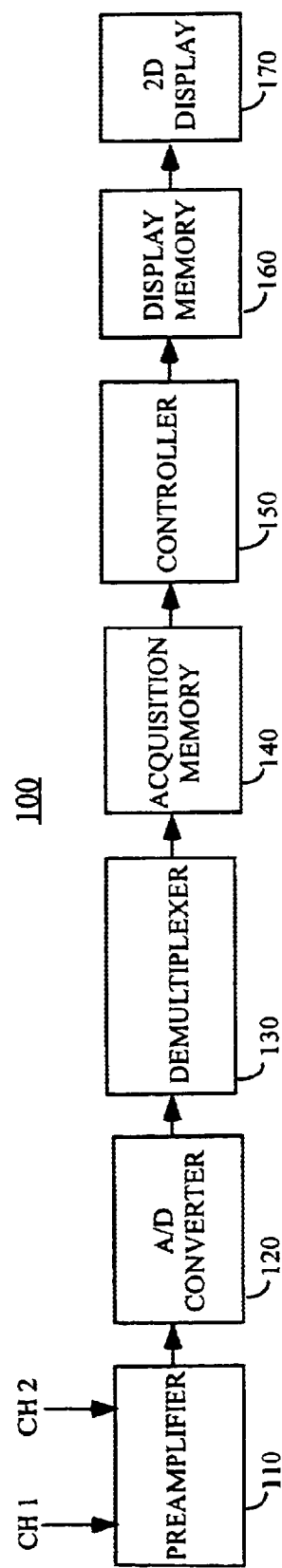
FIG. 1 is an illustration showing a simplified block diagram of a typical Digital Storage Oscilloscope as known from the prior art.

Referring to FIG. 1, an architecture for a typical digital storage oscilloscope 100, as known from the prior art, comprises a serial arrangement of a Preamplifier 110, an A/D Converter 120, a Demultiplexer (Demux) 130, an Acquisition Memory 140, a controller (microprocessor, or .P) 150, a Display Memory 160, and a Display unit 170, in that order. This kind of arrangement is typically configured on one or two printed circuit boards and is not reconfigurable by a user.

One skilled in the art will readily recognize that an oscilloscope according to FIG. 1 requires real-time software that must have intimate detailed knowledge of the custom hardware ICs used in implementing the oscilloscope design. This is an extremely complex problem because whenever the hardware design changes, even slightly, the software team must revise the software accordingly. This situation is compounded by the fact that the system real-time software must support all of the different hardware configurations that are produced. Clearly, as the number of hardware configurations grows, it becomes more and more difficult to create new versions of the products without inadvertently adversely affecting the operation of existing and prior versions of the products. That is, the design team must have knowledge of the history of all previous configurations in order to be able to safely produce a new configuration. The SDO architecture described herein eliminates this problem.

Figure 2:
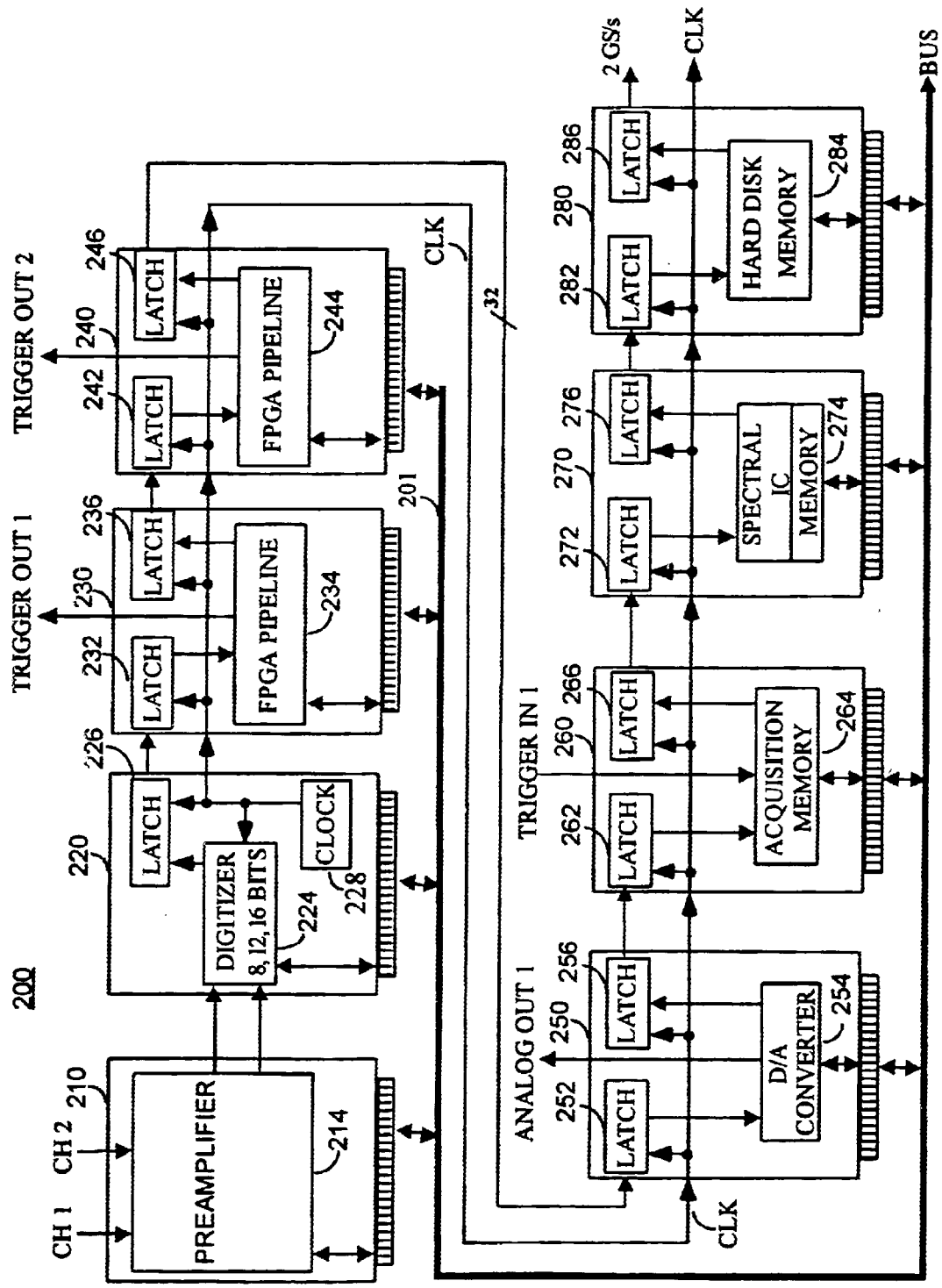
FIG. 2 is an illustration showing a simplified block diagram of a Streaming Distributed Oscilloscope (SDO) according to the subject invention.

FIG. 2 is an illustration showing a simplified block diagram of the major elements of an SDO 200 in accordance with the subject invention. In an SDO architecture an object oriented approach is used that isolates the behaviors of given modules, and their hardware details, to separate respective modules. Any given module contains all logic needed to supply a standard, generic, and constant, output signal, no matter what later enhancements are made to the module hardware.

The SDO architecture is designed so that each kind of module in the data stream has a standard set of attributes. With this approach a new preamplifier can be designed and plugged into the system without changing any of the SW on the PC side of the interface. A new memory board can be designed and installed with no changes except to the memory board itself.

It is important to note that by use of the streaming distributed oscilloscope architecture, a new custom application comprising both hardware and software components can be developed in 3 to 6 months. Even more significant is the fact that with standard available streaming scope module options and their libraries, new application configurations can be developed in a matter of minutes, rather than weeks.

In this regard, note that any number of channels is possible because of the modularity of the SDO architecture. Modularity also makes preamplifiers selectable and interchangeable (e.g., standard 1 GHz, differential, wireless, optical, audio/servo 10 Mhz). Digitizer Modules choices would include 8-bit 2 GS/s, 12-bit 100 Mhz, and 16-bit 20 Mhz modules. Memory modules of 256 Mbytes, 128 Mbytes, and 64 Mbytes are equally easily interchangeable. Digital-to-Analog (D/A) modules are selectable from standard 8-bit, 12-bit, and 16-bit modules. Choices of Spectrum Analyzer Module for real-time spectrum analysis include either an FFT-based processor or a swept digital filter. Stream Processor Module Options will most-likely be Field Programmable Gate Array (FPGA) based for processing data stream for measurements and triggers based on measurements, or for an event search on the data stream. Signal Source Modules may include 8 bit D/A, 12 bit D/A, 16 bit D/A, Optical, and H.V Pulser options. Lastly, it is noted that FPGA processors can implement digital filtering of various kinds without undue difficulty. Heretofore, choices such as those listed above used to require major software redesign, but it is herein recognized that an SDO can be reconfigured by a user at his site to include any of these choices. That is, a user of an SDO can configure the system hardware and its software library in minutes to create a new oscilloscope application.

It is envisioned that an SDO will operate at a sample rate of 2 GS/s for one channel, and 1 GS/s for two channels. SDO architecture also provides for standard waveform capture from multiple points in the data stream. With SDO architecture it is possible to provide simultaneous multiple triggers and multiple acquisition memories on one data stream. That is one may select both edge trigger and trigger-on-measurement values on one data stream.

Another particular advantage of the SDO architecture is that an SDO processes continuous data streams without missing samples. That is, measurements can be made on all samples; there is zero dead time. The processing pipeline may consist of one A/D board and as many of each of the other type of boards as desired. These additional boards may be configured in any desired pressing order in the pipeline.

As noted above, an SDO employs a configurable bus architecture. That is, an SDO is in essence a series of modules on a bus. Referring again to FIG. 2, a Streaming fl Distributed Oscilloscope (SDO) 200 is shown. A PREAMPLIFIER MODULE 210 which may be a high sensitivity, standard, or optical preamplifier is the first module on a SERIAL INTERFACE BUS 201. SERIAL INTERFACE BUS 201 is preferably a fiber channel optical serial interface bus. PREAMPLIFIER MODULE 210 includes a channel input connection Ch1, Ch2 for at least one channel. Analog output signals from PREAMPLIFIER MODULE 210 are applied to a DIGITIZER MODULE 220 for sampling and conversion to a series of digital signal samples. DIGITIZER MODULE 220 employs an ND converter (Digitizer) 224 of eight-bits for generating a continuous 2 GS/sec data stream, or a twelve, or 16-bit AID, for generating a continuous data stream at a slower rate than 2 GS/sec.

The data stream is applied to the next board 230 via a FIFO (First In First Out) circuit 226 and by a ribbon cable (shown as an arrow for simplicity). FPGA boards 230, 240 can be daisy-chained as the data stream is piped from one board to the next. Multiple FPGA boards can be added to interleave multiple A/D converters to increase the real time sample rate.

A D/A converter board 250 can be inserted between any of the processor boards in the chain to generate analog output signals as needed. A typical D/A Converter board includes an input FIFO 252, a D/A Converter circuit 254, and an output FIFO 256 for coupling the data stream to the next board in sequence. D/A converter board 250 can be used to trigger an external oscilloscope or other test equipment (not shown). D/A converter board 250 may also be used to provide external control signals or signals for external monitoring of continuous measurement results. A MEMORY BOARD 260, 270 can be located at any place in the data stream, and can be used, for example, to create a DPO data base or capture frames of data for display.

An ACQUISITION MEMORY BOARD 260 is configured to receive an input data stream and to output the data stream to the next board in the pipeline. Upon receipt of a trigger line signal from one of the previous FPGA boards 230, 240, a frame of data would be captured and stored. This frame is then made available to the PC bus 201 where it will be applied to a display (not shown). Memory boards (or modules) have multiple trigger inputs so that it is possible to capture waveforms based upon different kinds of triggers in different parts of the data stream.

Operation of measurement triggers is one of the most valuable and unique aspects of this architecture. An FPGA module performs constant measurements on all occurrences of events such as rise time, amplitude, period, etc. A trigger may be output from the FPGA board based on any of these measurements. This trigger signal may be connected to any of the acquisition memory modules that may be distributed throughout the processing chain. Although no analog trigger circuitry is required, analog triggers may be implemented as part of the architecture, if desired. Preferably, a Trigger Switch Matrix Module is employed to allow a control PC to configure which trigger goes to which acquisition memory module. Such a Trigger Switch Matrix Module is described below with respect to FIG. 11.

Other kinds of boards such as, signal generators, spectrum analyzers, and other processing modules may be inserted anywhere in the data stream, as needed.

It is herein recognized that a HARD DISK DRIVE MODULE 280 could be configured in the data stream (for example, at the output terminal of FIFO 276) to receive and store every incoming sample (for example, 20 Giga-samples of data). This is true if the sample data rate does not exceed the hard disk writing speed. The actual storage size is limited only by the disk drive size chosen.

Any desired number of processing channels can be connected in minutes by use of Optical Fiber channel 201 that allows additional slave systems to be connected. One skilled in the art will note that software, such as JAVA, can be programmed to automatically recognize all of the slave system boards that are connected.

Figure 3:
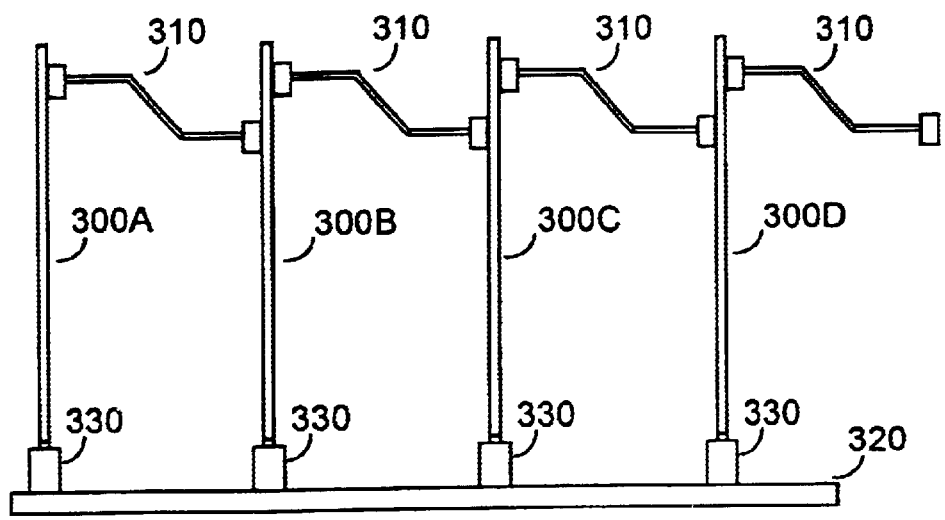
FIG. 3 is a simplified side-view pictorial illustration of connections between SDO modules of FIG. 2.

FIG. 3 shows a side-view of four modules 300A, 300B, 300C and 300D, connected to a motherboard 320 via respective connectors 330. Preferably, Ribbon Cables 310 are used to couple high sample rate signals between modules 300A, 300B, 300C and 300D. The use of ribbon cable 310 provides advantages over conveying the signals via printed circuit board traces on a mother board. Ribbon Cables 310 make it easy to add more data streams to expand the interleave capability. Such an expansion would be far more difficult for the case in which the data streams were conveyed via printed circuit board traces on a mother board, because additional connectors and bus traces would have to be added. Physical space on a circuit board is always at a premium, and the additional traces would compete for such space against other communication bus and power supply traces.

Figure 4:
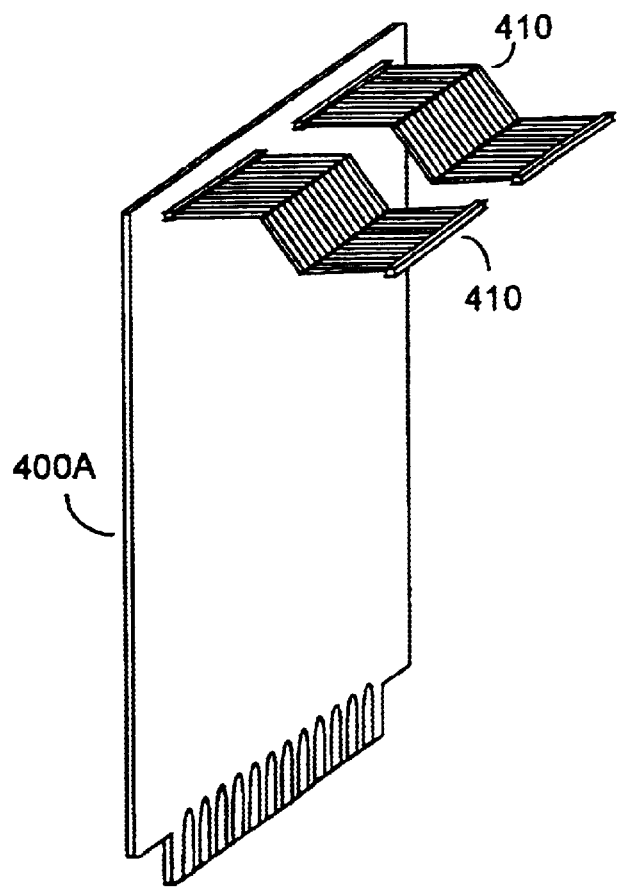
FIG. 4 is a simplified perspective-view pictorial illustration of the ribbon cable connection of FIG. 3

FIG. 4 shows a perspective view of an SDO module 400A having two ribbon cables 410 for connecting the data stream from one SDO module to the next. Similar numbering of elements in FIGS. 3 and 4 indicate a similar function of those elements.

Figure 5:
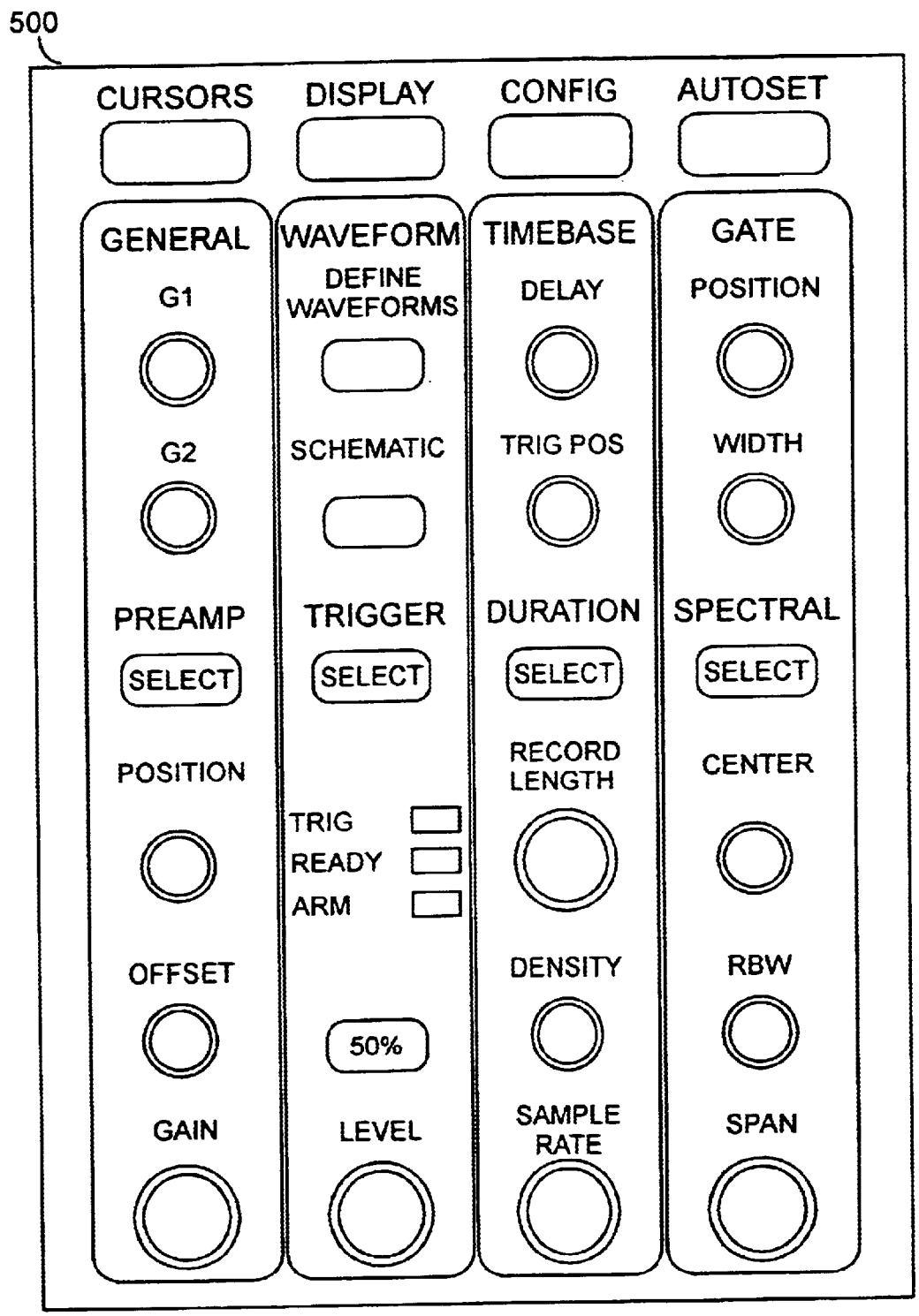
FIG. 5 is an illustration of an SDO control panel useful for practicing the invention.

FIG. 5 is an illustration of a Front Panel 500 for controlling an SDO. Most of the controls of Front Panel 500 are well-known in the oscilloscope art, and need not be described. It is important to note that an SDO is different from DSO's in that multiple timebase settings can be employed simultaneously in an SDO system. That is, a user can set several different timebase settings within one data stream as well as different settings from other data streams. Therefore, the overall structure of timebase control in an SDO is fundamentally different and far more flexible than in a DSO.

In general, a timebase has two basic parameters that are controlled. These are the record length of an acquired waveform and its sample rate. However, in the data stream of an SDO, there is no record length; only sample rate is relevant. Moreover, as stated previously, the sample rate may vary at different points of a data stream. In addition, there may be more than one acquisition memory module installed in a data stream, and acquisition memory module could be operating with different sample rates and record lengths.

Sample rate in an SDO is determined by a processor module in a data stream. Record length in an SDO is determined by the size of an acquisition memory module in a data stream, and different memory modules in the system may be setup for different record lengths.

When the front panel horizontal timebase controls are "attached" (i.e., logically assigned) to an SDO channel, the default setting will be to use the first decimator that occurs in the stream for sample rate and to use the first acquisition memory in the stream for record length control. However, during normal use, the last setting of the modules that were controlled is stored.

Traditionally, a DSO controlled the duration of a signal that was captured in acquisition memory by adjusting the sample rate using the horizontal scale knob on the front panel of the scope. However, in an SDO, it is necessary to maintain better control of the sample rate because it also affects the available signal processing bandwidth. Changing the sample rate at one point in a data stream will affect everything down stream. The processor board or boards that are in a data stream control the sample rate. A human interface allows a user to select a particular data stream in the SDO and a particular processor in the stream for sample rate control. Record length may be adjusted independently for each Acquisition Memory Module in a data stream. A human interface allows a user to select a particular data stream in the SDO and a particular acquisition memory module in the stream for record length adjustment. Different Acquisition Memory Modules may be set for different record lengths. Adjusting record length truly changes the duration of the waveform in acquisition memory without changing the available bandwidth and without affecting any of the signal characteristics down stream.

The Density Control is associated with a specific acquisition memory module. Its operation causes the simultaneous adjustment of the sample rate of the next available decimator up stream, and the record length of the acquisition memory module being controlled. The idea is to maintain the same acquired waveform time interval, but change the number of samples that cover that interval. This feature requires both the record length and sample rate to change simultaneously.

Figure 6:
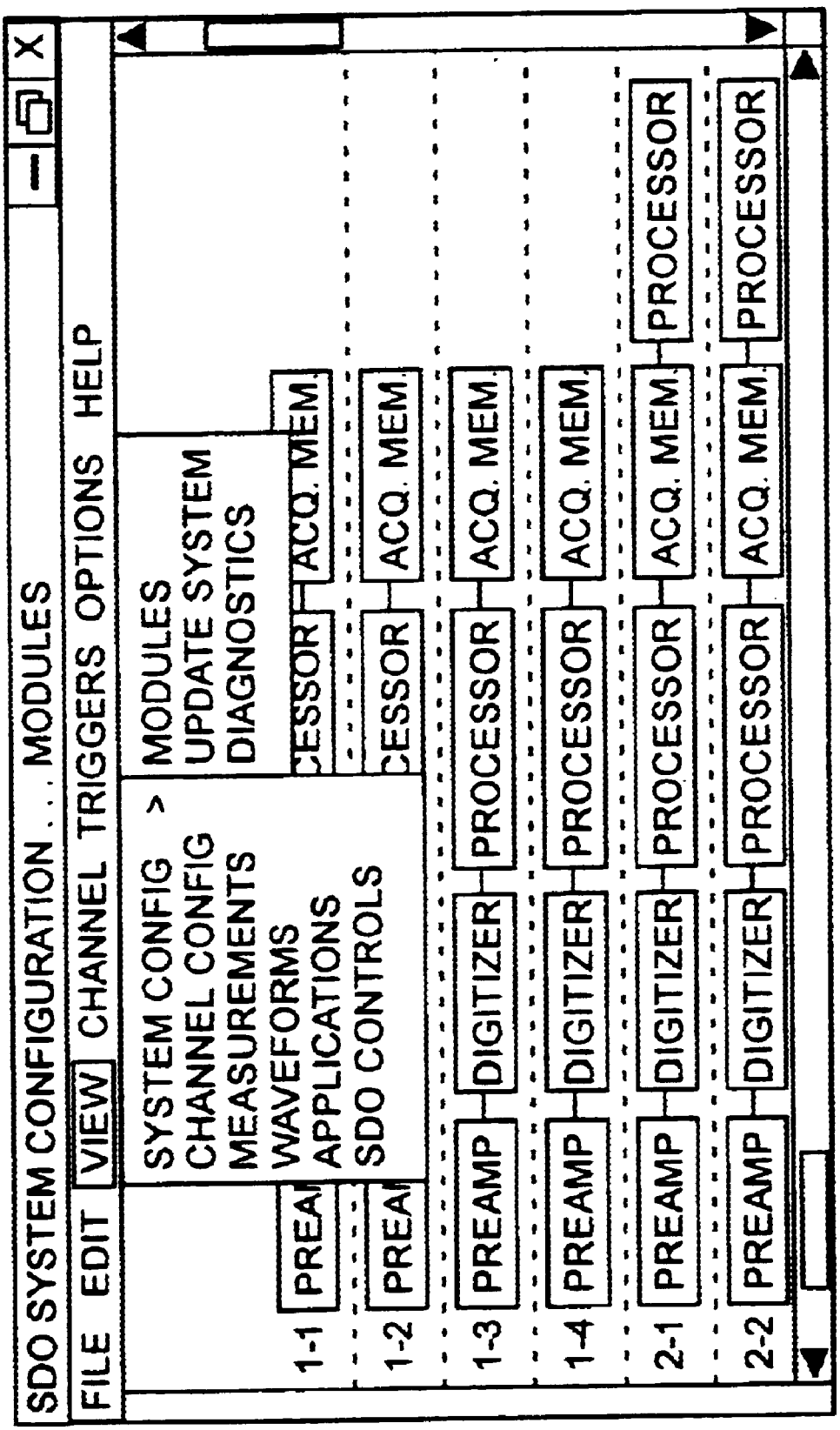
FIG. 6 is an illustration of a screen display according to the subject invention.

FIG. 6 is an illustration of an SDO human interface menu. The window display of FIG. 6 shows the configuration of the hardware modules of a particular SDO system. This display shows all channels that are present in the master unit and in all of the slave units that may be attached. Clicking (with a mouse or by use of a touch screen) on any module box will bring up a module configuration window (not shown) that will allow the user to set up the controls and parameters for that module. Dragging a box over a column of similar modules will cause them to all be highlighted and locked together. Clicking the right mouse button will then cause the module configuration window to come up for adjustment of all selected modules.

Figure 7:
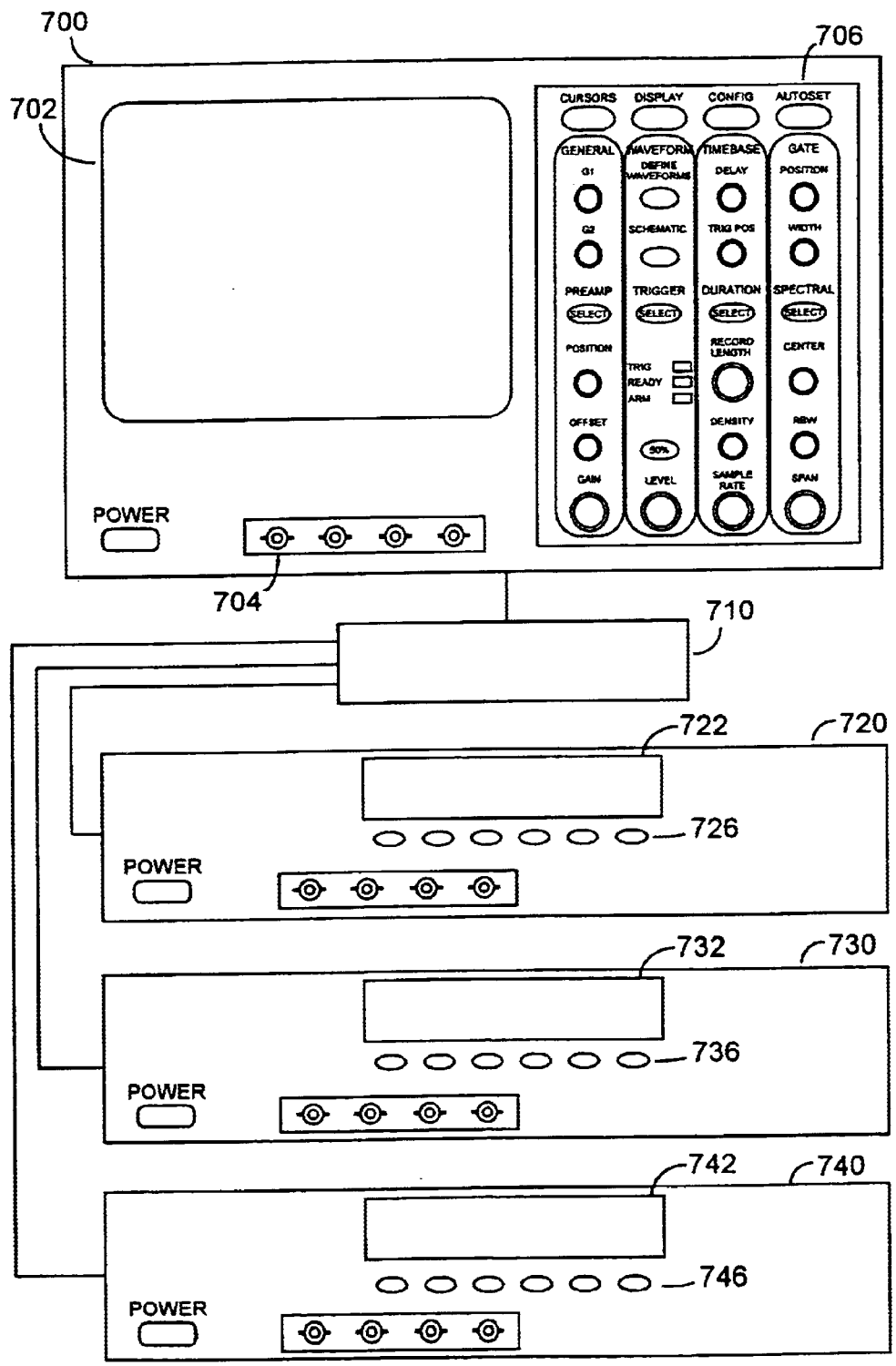
FIG. 7 is a front-view pictorial illustration of an SDO Master Unit and SDO Slave Units in accordance with the invention.

With reference to both FIGS. 6 and 7, the identification (ID) numbers for each channel are of the form, unit number—channel number. For example, the ID number 1-3 designates the third channel in Master unit 700. The numeral "1" always designates Master unit 700. The ID number 3-1 designates the first channel of a slave unit with ID number of 3. Clicking on the unit and channel number will bring up the Channel Configuration Menu window. The purpose of the Channel Configuration Menu is to allow a user to configure the library functions of processors and the parameters of various modules within a channel, including DSP functions, triggers, etc. Note that although channels may contain subchannels, subchannels are not shown in the screen display of FIG. 6. Subchannels are displayed in a Channel View menu (not shown) and in the Channel Configuration Schematic window of FIG. 9. The schematic shows individual subchannels or interleaved channels, and trigger connections.

FIG. 7 illustrates that an SDO system may be configured using one Master unit 700 and any number of Slave units 720, 730, 740. The SDO Master unit and Slave units are interconnected via an Optical Fiber Channel Interface unit 710.

SDO Master unit 700 contains the main system processor (not shown), preferably running Windows 2000 or a later version of an operating system. It also contains a display device 702 and is capable of providing a video signal to an external monitor. It can be controlled via mouse and keyboard options (also not shown). SDO Master unit 700 includes a Front Panel 706, similar to that of a conventional oscilloscope. However, it should be noted that Front Panel 706 differs from that of a conventional oscilloscope by the inclusion of special controls for defining waveforms and controls for performing spectrum analysis, as described above with respect to FIG. 5.

Referring again to FIG. 7, SDO slave units 720, 730, and 740 contain only a power supply, signal sample processing channels, and a minimal processor for controlling initialization, communication, and localized control functions. Master unit 700 has the ability to recognize all slave units that are connected and to configure its control menus accordingly. Master unit 700 includes control knobs that may be logically attached to control any channel in the SDO system including those physically located in the slave units. Slave units 720, 730, 740 contain a small LCD display 722, 732, 742, capable of showing a configuration ID number assigned by Master unit 700 when the particular slave unit is connected into the system. It is further envisioned that an SDO system would have complete Internet controllability. That is, an SDO instrument would have some basic file and screen dump utilities and the ability to connect to the Internet for outputting measurement results, and for controlling remote slave units. This feature allows telecom facilities to remotely monitor many parts of an SDO system from one central location via the Internet.

FIG. 8 is a screen display showing defined waveforms for an SDO system. Each waveform in an SDO system is defined by a particular active trigger applied to a particular Acquisition Memory Module. The term "active" means that a trigger source has been connected to a trigger input and that the waveform has been defined as shown in the window display of FIG. 8. The "Define Waveforms, Trigger Receivers" menu allows the user to define waveforms by assigning processor trigger sources to Acquisition Memory Module input trigger terminals. This menu allows the user to define the receivers of triggers and assign a waveform ID and name label to a particular waveform. A "Define Trigger Sources" menu (not shown) allows the user to define the sources of triggers, and to define what kind of event will cause each trigger. Trigger sources are either external, or from a processor module or from another memory module.

Figure 9:
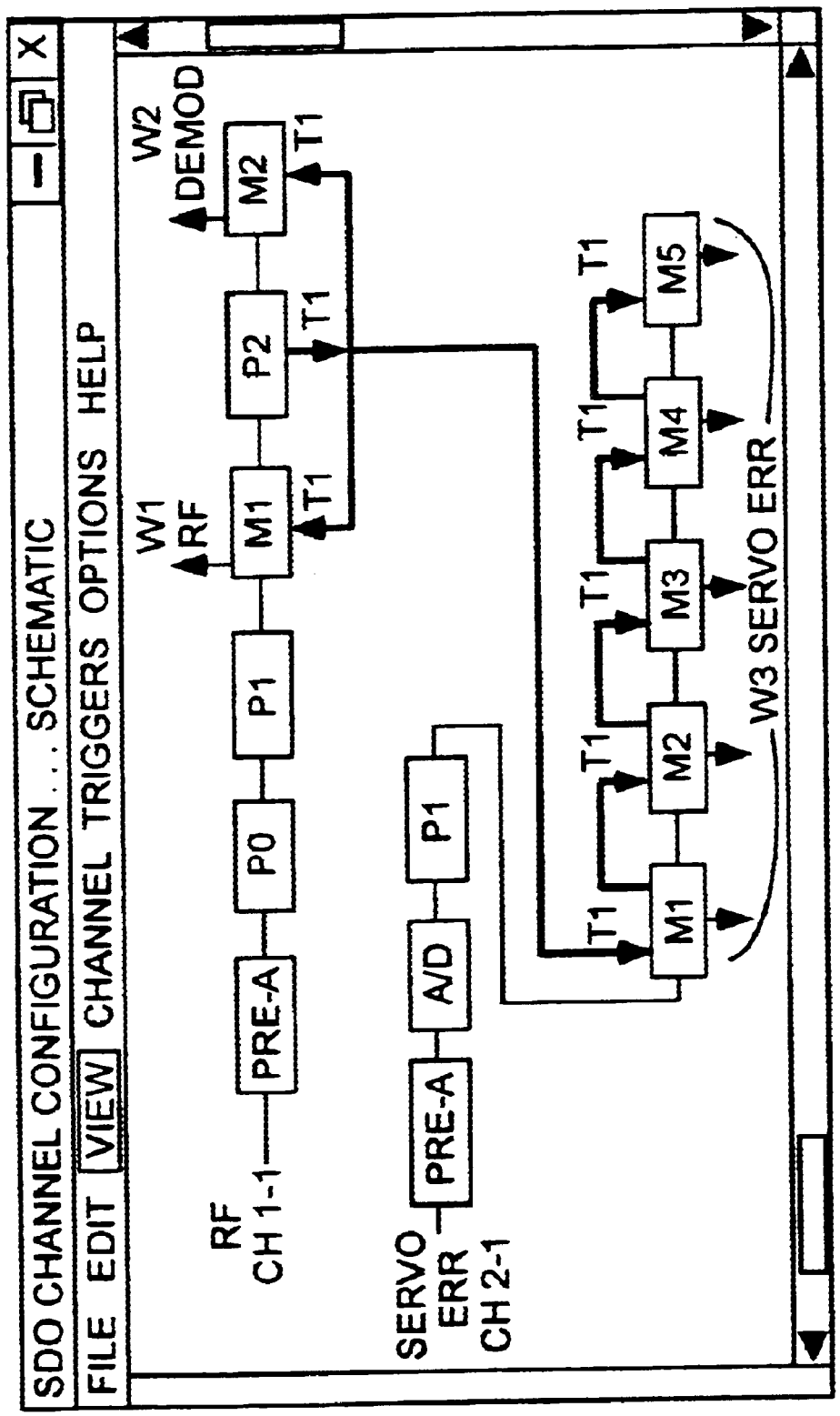
FIG. 9 is an illustration of a screen display according to the subject invention.

The "waveforms" defined in the menu window of FIG. 8, actually define a channel hardware configuration shown in FIG. 9. Each block shown in FIG. 9 represents a module in an SDO channel. In the example of FIG. 9, a servo control signal has been transmitted via amplitude modulation to a remote part of the system. This signal has been applied to the input of channel 1-1 of the SDO, has a waveform ID of W1 and a label of RF. A Processor Module, designated P2, in channel 1 performs the functions of AM demodulation and decimation to a lower sampling rate. Processor P2 produces a demodulated control signal that is pulsewidth modulated. Processor Module P2 has also been setup to produce a trigger signal T1 when the pulsewidth of the control signal exceeds a specified value. This trigger signal is fed back to an Acquisition Memory Module, designated M1. That is, the RF signal is captured in response to a trigger T1 produced from the demodulated signal. The trigger is also applied to channel 2-1 (in slave unit 2). Channel 2-1 receives an error signal from the servo system at an input, and has been configured for an extremely long (i.e. ultra-long) record length of 320 Msamples.

Referring to FIG. 9, the hardward blocks located in a given channel are sensed by the system controller PC and a schematic is automatically drawn in a screen display. A configuration of this hardware may be altered by dragging and dropping various blocks in the window display of FIG. 9, and connecting the blocks as desired. The user completes trigger connections by means of a mouse or other drawing capabilities. Operating graphically on the schematic of FIG. 9 will affect the waveform list of FIG. 8, which will change to match the new configuration. Conversely, altering the list of FIG. 8 will cause a change in the schematic channel representation of FIG. 9.

Each waveform that is available for display or capture in the system has an ID number associated with it. This will be W1, W2, . . . WN where N is the number of waveforms that have been defined in the system. Referring back to FIG. 8, note that the waveform ID column indicates that three waveforms were created W1, W2, and W3. The waveform, W3, has subsegments because it is constructed from the waveforms acquired in multiple Acquisition Memory Modules. This is due to the fact that Acquisition Memory Modules have trigger outputs that generate an output trigger signal at the instant the Acquisition Memory Module has completed an acquisition. This trigger output signal T1 is then applied to a trigger input terminal of the next Acquisition Memory Module in the data stream. In this way, an ultra long record length acquisition may be acquired by cascading in series as many Acquisition Memory Modules M1, M2, M3, M4, M5 as desired.

The user may assign a label to each waveform that is defined in the system. This makes it easy to associate the waveform with the part of the device under test from which it was collected. Waveform labels preferably comprise 8 characters or fewer. The Triggers Assignments column of the window display of FIG. 8 contains the information needed to specify a system waveform (i.e., a trigger source and a memory). Ch(<a-b>) identifies which channel contains the source processor. The "a" represents the number of the channel and the "b" represents the sub channel number within that channel. P<n> specifies the processor module that is the source of a trigger. Processor modules "n" in a channel are labeled as 1, 2, . . . N for N modules in the channel. M<n> identifies the Acquisition Memory Module in the channel that will store the waveform. The value of "n"

is a number such 1, 2, . . . N where N is the number of memory modules contained in the channel. T<n> identifies the trigger input terminal on the memory module that is associated with the channel. The value of 'n' may be 1, 2, . . . N where N is the number of trigger input terminals available on the memory module. Ext may be used to signify that the trigger source is external.

It is important to note that every waveform in the system must have a trigger. Even if there were only one acquisition memory module in the channel, it is possible to have up to 32 waveforms defined that can be triggered and captured within that memory. For that case, all waveforms acquired would have a different time stamp. For the case where all channels are to be acquired with the same time stamp it would be necessary to have a separate Acquisition Memory Module for each waveform. Typical SDO Acquisition Memory Module memories will contain one, two, or four input data streams, and can store 1, 2, or 4 waveforms simultaneously. At least one trigger connection is needed for each memory board that is contained in the system.

In conventional DSO architecture, the user was limited to one trigger condition at a time for all channels. In other words a DSO acquires all four channels based upon one trigger. In contrast, the trigger system that can be configured in an SDO is incredibly versatile. The SDO architecture is unique because it is capable of simultaneously using many triggers of various types on multi channels. Multiple triggers of different types can even be utilized within a single channel. This is true even if there is only one timebase within the channel, because a single processor module can generate multiple trigger output signals based upon different measurements.

Figure 11:
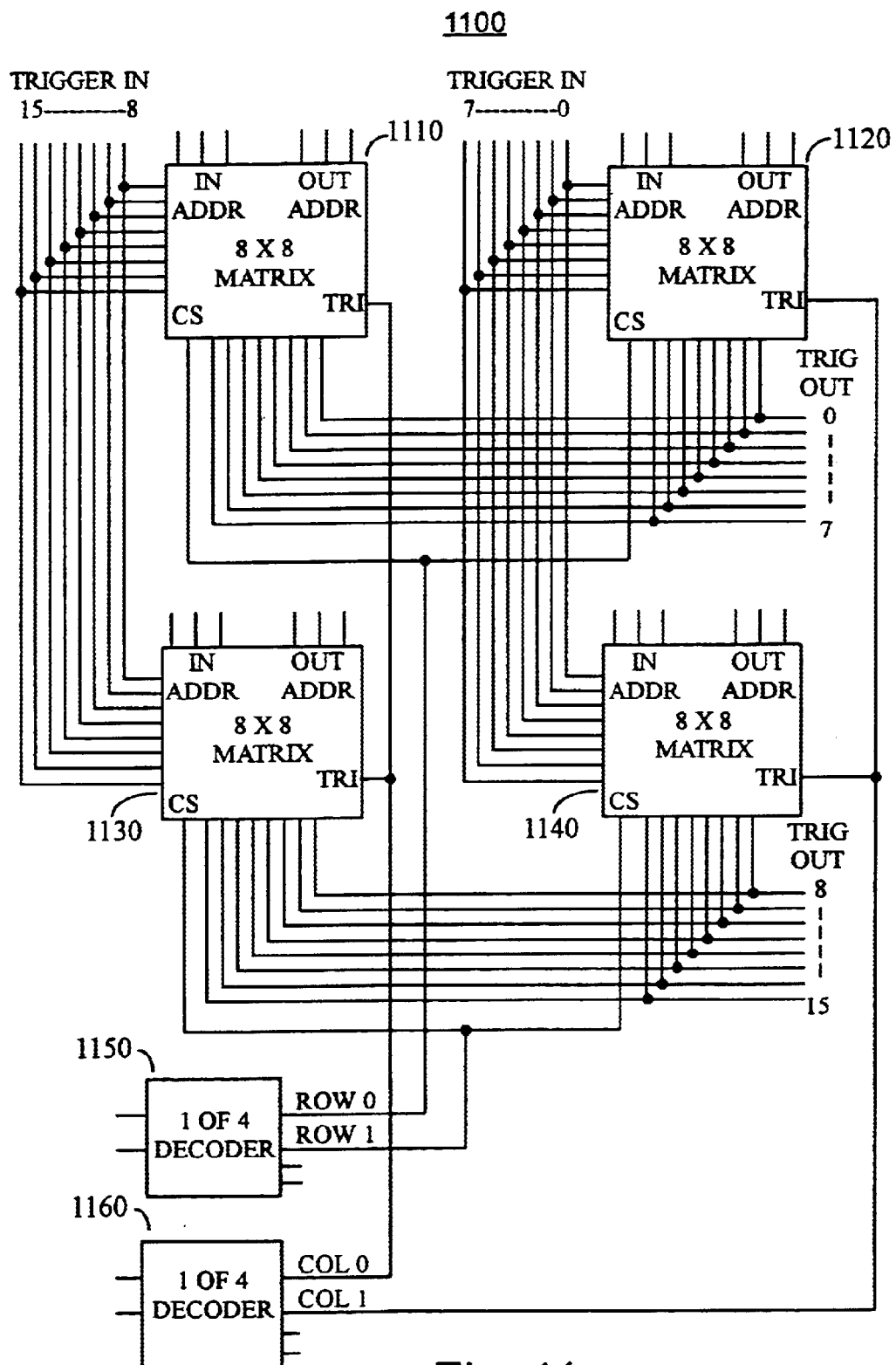
FIG. 11 is a simplified block diagram of a Trigger Matrix Board suitable for use with the invention.

The process of setting up a trigger to a memory defines an acquired waveform. The first step in the process is to physically wire the trigger outputs of processor boards in the channels to trigger inputs of memory boards in the channels. Trigger outputs and inputs are accessible on the back panel of an SDO unit. Lengths of cables will affect the timing of the triggers between channels. However, each trigger input has its own delay counter 1040A, 1040B, . . . 1040N so that overall system timing may be properly aligned. The user may do this manually, but it is preferable that software applications automate the trigger alignment routine for all of the various channels. Approximately 32 trigger interconnect lines may be formed onto the mother board such that within a channel any trigger output could be routed to any trigger input. Another alternative is to put the switching logic for trigger routing onto a plug-in Trigger Switching Matrix Module. Such a Trigger Switching Matrix Module is shown in FIG. 11.

The second step of the process is to access the Waveform Definition menu and input data that informs the system how the triggers have been wired. In the case wherein a Trigger Switching Matrix Module is employed, it is unnecessary to input the informative data because the system already is aware of the trigger configurations. Once the system has been wired for triggers, a list is generated. An acquired waveform is defined for each of the triggers that have been defined in the system. The maximum number of triggers that a single Acquisition Memory Module may input is 32 according to the abstract interface for memory boards (to be discussed below).

The final step is to configure each trigger output on each processor board for the desired type of event that will cause generation of the trigger signal. The available trigger types will depend on the kind of processor board used, and the library of functions that are available for it. For an example, an FPGA Processor Module has a certain set of measurements that may be used to generate triggers. Also, an SDO system may include Analog Trigger Modules utilizing custom ICs that have their own library of trigger types.

As shown in the screen display of FIG. 9, system software can detect the modules plugged into the bus and display a block diagram of the current system configuration. Selecting a block in the processing block diagram would bring up the configuration menu that allows the customer to set the control parameters for that particular board. If the selected block is a processor board then available measurements or signal processing functions may be selected. With this approach, system hardware modules can be configured in any order or different kinds of boards may be employed, as desired. No new software design or hardware design is needed in order to configure the new system. A default setup can be used and the customer can change it to obtain any kind of process or measurement available in the system software libraries.

Figure 10:
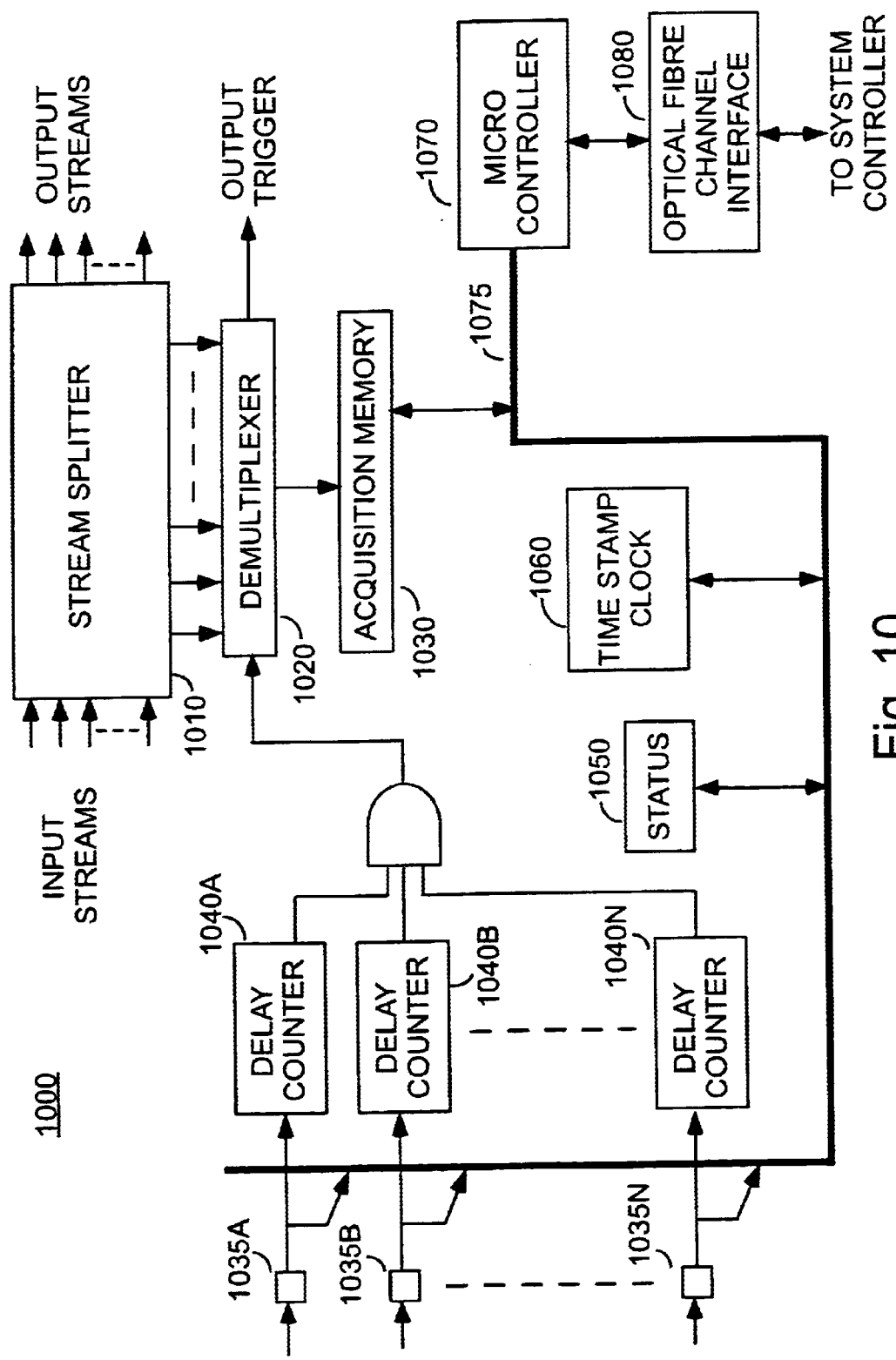
FIG. 10 is a simplified block diagram showing circuit elements of the SDO Acquisition Memory Module of FIG. 2.

FIG. 10 is a more detailed illustration of ACQUISITION MEMORY BOARD 260 of FIG. 2. A Stream Splitter unit 1010 of Acquisition Memory Module 1000 receives data from any number of 16-bit data streams via ribbon cables referred-to above. These data streams may be received continuously at full data rate, minimally 1 GS/sec. Higher rates may be possible. It is noted that a Demultiplexer 1020 can be implemented on the MEMORY BOARD 260 to slow the data rate to a rate usable by Acquisition Memory 1030. Stream Splitter Unit 1010 outputs all samples received from the input stream to the next module in the channel. In this way, a second Acquisition Memory Module can acquire a different waveform from the same data in response to a different trigger. This is a powerful feature in that multiple waveforms can be collected from different parts of the data stream based on different measurement triggers. For example, one memory module can collect and store waveforms triggered by a large amplitude variation, while a second memory module can collect acquisitions based on out-of-limit period measurements.

In this regard, it is herein recognized that memory boards, inserted at multiple points in the data stream collect waveform traces from each point based on different measurement triggers. "Good" traces can be stored into one display memory database, while bad ones detected by use of the measurement "triggers" are stored into a memory database for "unusual" waveforms. Alternatively, data relating to "bad" traces can be stored as individual traces, if they occur rarely enough. Or, the "bad" ones can be stored in a waveform FIFO buffer that keeps the last 10 (or so) waveforms as individual traces and all traces which are clocked out of the end of the FIFO buffer are stored in a single "bad data" database.

Acquisition Memory 1030 is operated in a circular manner. That is, when Acquisition Memory 1030 is enabled, data from an input stream is continuously written to it, overwriting data previous stored at those locations. Acquisition Memory 1030 does not become armed, ready to receive a trigger, until the specified number of pretrigger samples have been received. Writing stops when a trigger has been received and the appropriate amount of post trigger data has been captured. That is, Acquisition Memory 1030 continuously acquires a waveform and stop storing samples when it receives a trigger. It will not begin acquiring again until it is rearmed.

This data being stored can be either one single signal at a high sample rate or multiple signals interleaved in the memory. Although all data streams are written simultaneously into this single memory, the system controller PC will never see interleaved multiple signals. Whenever the system controller PC asks for data relating to waveform #3 of four waveforms, it will sequence addresses by increments of one while the internal memory module logic (Micro Controller 1070) will increment addresses by the appropriate amount to read the data relating to waveform #3.

It is envisioned that Acquisition Memory Module 1000 will have at least two trigger input terminals 1035A, 1035B, . . . 1035N. Trigger input terminals 1035A, 1035B, . . . 1035N are mounted on the back edge of the board and are accessible at the back of the instrument. The user may extend these terminals to a front panel on a rack if input trigger sources must be changed from time to time.

Each trigger input terminal couples input trigger signals to a Delay Counter 1040A, 1040B, . . . 1040N. Delay Counters 1040A, 1040B, . . . 1040N allow data of the various channels and subchannels in the SDO to be deskewed. That is, they are used to provide timing calibration.

In addition, Acquisition Memory Module 1000 will have one output trigger terminal, at which is produced an Output Trigger Signal. This Output Trigger Signal is generated at the instant that Acquisition Memory 1030 completes an acquisition. The primary use of this output trigger is to feed the trigger input of another memory module. In this way extremely long record length acquisitions may be obtained. As many memory modules as desired may be cascaded in this manner. Another use for the Trigger Output signal is to provide an interrupt signal to the main system processor (or system controller PC).

Acquisition Memory Module 1000 interfaces to the system controller PC through a Serial Optical Fiber Channel Interface 1080. Optical Fiber Channel Interface 1080 was chosen over a standard PCI bus because standard PCI buses are limited to only four slots. If desired, for internal data bus communications, an electrical data transmission channel may be used to reduce cost. However, it is recommended that for external bus interface with slave units, that an Optical Fiber Channel be employed to increase operating distance. In this regard, Optical Fiber Channel Interface 1080 allows multiple channels of SDO to operate in multiple physical boxes distributed through out a rack mount system, as shown in FIG. 7.

Acquisition Memory Module 1000 further includes an internal bus 1075 coupled to a Time Stamp Clock unit for recording a time stamp that is associated with each trigger that occurs. Micro Controller 1070 of Acquisition Memory Module 1000 handles all aspects of each memory read operation. The SDO architecture frees the system controller PC from the necessity of being burdened with any internal knowledge regarding the logic control of Acquisition Memory Module 1000. The system controller PC communicates to Acquisition Memory Module 1000 via the Micro Controller 1070 through a standard abstract interface to be described below. Because of this feature, changes in the hardware design of Acquisition Memory Module 1000 will not require any changes in the system firmware. Thus, the hardware is up-graded without time-consuming software design efforts.

FIG. 11 is a simplified illustration, in block diagram form, of a Trigger Switch Matrix Module, generally designated 1100. In this example, Trigger Switch Matrix Module 1100 is set up as a 16×16 trigger matrix. That is, any of 16 input trigger signals may be connected to any of 16 output trigger terminals. The matrix comprises four 8×8 crosspoint switch modules 1110, 1120, 1130, and 1140, which may be CLC018 1.4 Gbps Digital Crosspoint Switches manufactured by National Semiconductor Corporation, Santa Clara, Calif. The 8×8 digital crosspoint switch ICs 1110, 1120, 1130, and 1140 are controlled by a row decoder 1150, and a column decoder 1160, preferably under control of a local controller (not shown for simplicity). The output terminals of crosspoint ICs 1110 and 1120 are Wire-Or'd together, as are the output terminals of crosspoint switch ICs 1130 and 1140. Wire-Oring of these output terminals is possible because the column control signals of IC 1160 are connected to the tri-state control terminals of each of crosspoint switches 1110, 1120, 1130, and 1140.

Figure 12:
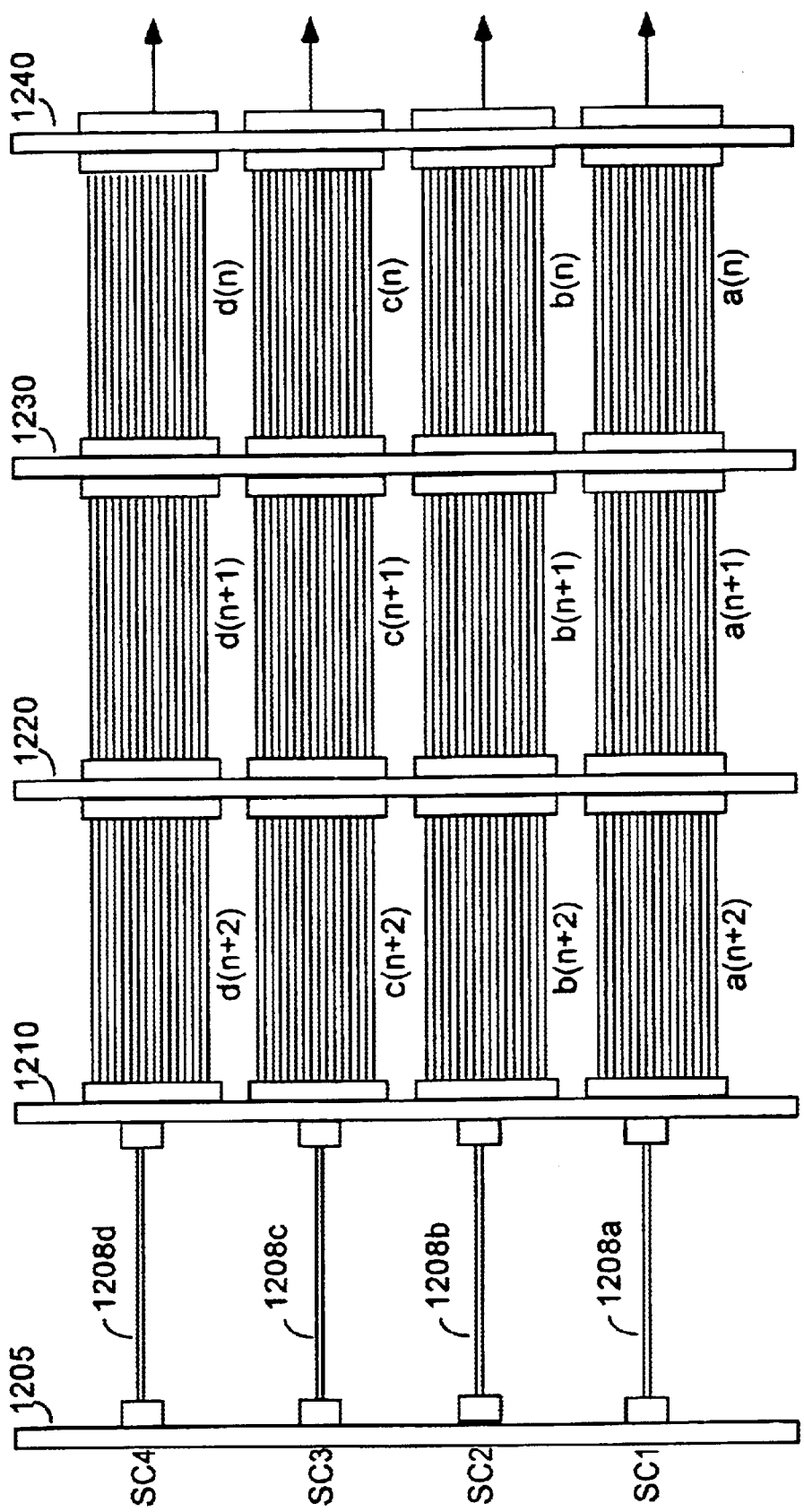
FIG. 12 is a top-view pictorial illustration of the connections between SDO modules of FIG. 2.
Figure 13:
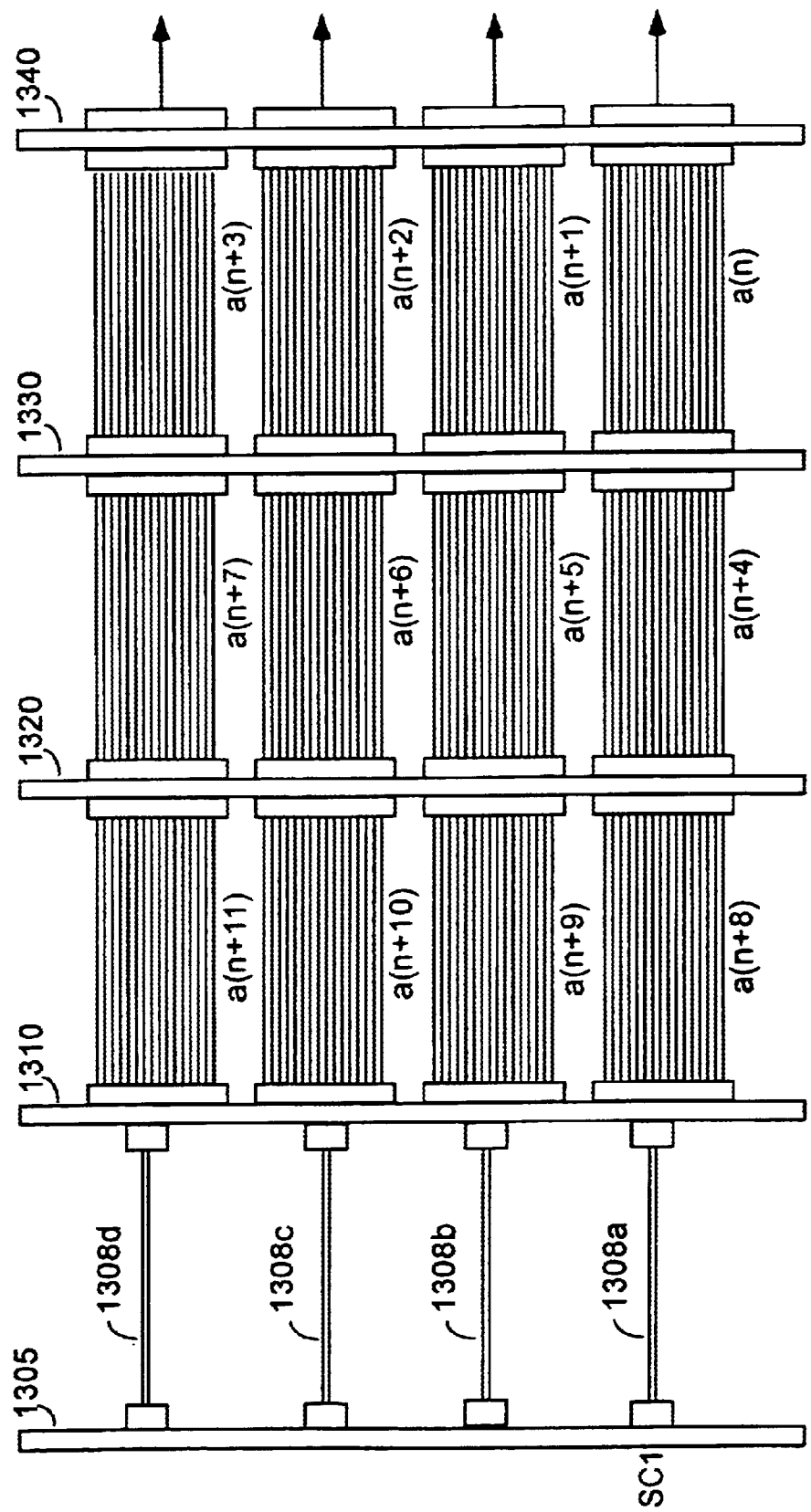
FIG. 13 is a top-view pictorial illustration of the connections between SDO modules of FIG. 2.
Figure 14:
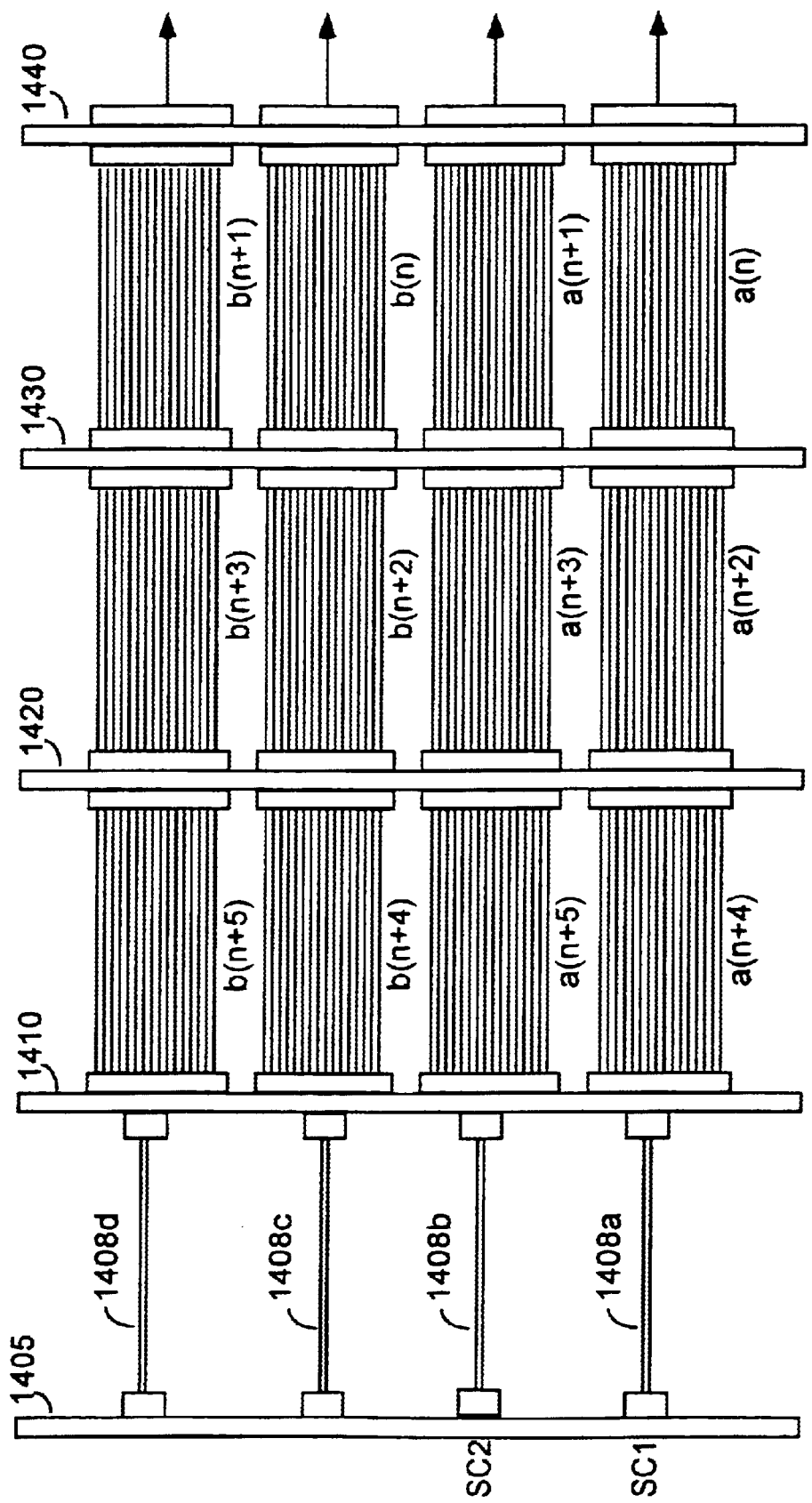
FIG. 14 is a top-view pictorial illustration of the connections between SDO modules of FIG. 2.

FIGS. 12, 13, and 14 show that each SDO channel may contain multiple subchannels. It is important to note that there is no requirement that SDO channels be identical. In fact, different channels may operate with entirely different sample rates, different bandwidths, and different processing elements than are used in other channels. The system software has the ability to recognize each channel and its associated subchannels, identify the modules they contain, and then automatically configure menus accordingly.

It is important to note that an "SDO channel", as the term is used herein, comprises a group of modules that are capable of performing many kinds of operations upon the analog and digital data streams that are passed serially from one module to the next.

Referring to FIG. 12, a particular SDO channel is shown having four subchannels SC1, SC2, SC3, SC4. This means that more than one signal is passing through the channel. For example, a channel may receive four input signals from four external probes. Each of these four signals may traverse through a subchannel of the channel.

The first module 1205 in an SDO channel is always a Preamplifier Module, for receiving external signals for measurement. That is, each preamplifier module that exists in an SDO system is considered by the main system processor to be the first element of a channel. Each processing module following the preamplifier in succeeding bus slots is an element of that channel. A very wide range of preamplifier modules is possible. Examples of preamplifiers are: standard oscilloscope, high sensitivity for micro volt level signals, wide bandwidth, narrow bandwidth low distortion for use with 16 or 24 bit A/D converters, differential, optical to electrical converters, and more. Preamplifier module 1205 may also contain a down converter.

While the following configuration is not shown in FIG. 12, it should be noted that any reasonable number of analog processing modules can be inserted in slots following the preamplifier slot and before the digitizer module. The analog processing modules would be selected to satisfy the requirements of a particular application. Examples of such analog processing modules are: anti-aliasing filters, other kinds of filters, demodulators, etc.

Signals from Preamplifier Module 1205 are coupled to a Digitizer Module 1210 via four coaxial cables 1208a, 1208b, 1208c, and 1208d. A channel may be formed by use of any desired number of modules of various kinds 1220, 1230, 1240 in any desired order following Digitizer Module 1210.

Note that the data streams are preferably coupled from module to module in synchronously with respect to a system clock. Hence, module 1240 receives a signal sample a(n), b(n), c(n), d(n) when module 1230 is receiving a later signal sample a(n+1), b(n+1), c(n+1), d(n+1), and when module 1220 is receiving an even later signal sample a(n+2), b(n+2), c(n+2), d(n+2).

As noted above, an SDO channel may contain any desired number of sub channels as long as the total is equal to $2^n$ where n is an element of $\{1, 2, 3, \ldots\}$. Each subchannel has one Digitizer Module 1210, 1310, 1410 as its source. Subchannel data can be organized as packed bytes, 16-bit integers, or as floating point data.

In addition, subchannels may be interleaved by factors of multiple of two, as shown in FIGS. 13 and 14. That is, the SDO architecture supports the concept of interleaving data streams to obtain higher sample rates than a single A/D converter can provide. FIG. 13 is an example of an SDO channel having a four-way interleave. FIG. 14 is an example of an SDO channel having a two-way interleave. When four-way interleave is in effect, then only one of the four input channels can be used. If two way interleave is in effect, then only two of the four input channels can be used. If no interleave is in effect, then all four input channels can be used.

One skilled in the art will recognize that sample clocks on the A/D board are skewed to perform interleaving. However, the output samples into each stream out of the A/D board will be deskewed. For example, if four-way interleave is in effect then four samples will leave the A/D board at exactly the same time into four different streams as shown in FIG. 13. If a D/A converter down stream converts an interleaved stream back to analog format, then it must also skew the samples to the correct time position.

Interleave factors are limited only by the number of digitizers and physical space in the system. For example, a digitizer board with 16 A/d converters at 1 GS/sec each could be configured to output eight data streams in packed byte data mode for a total sample rate of 16 GS/s. However, such a configuration may not be practical in terms of physical space required in that 16 ribbon cables of 8-bits each would be needed on each digitizer board in order to pass the streams to following processors.

Digitizer Module 1210 contains an A/D converter for generating the streams of digital data samples. These data streams are passed from one module to the next in a given channel via ribbon cable connectors, as described above. It should be noted that processor modules may modify the data stream by filtering or by performing other transform algorithms before passing the data to the next module. Decimation and interpolation of the sample rate are two such possible operations on a data stream.

Data streams in an SDO represent digitized versions of input signals to be measured. Data streams may also be generated by internal modules in an SDO. For example, the output of an A/D converter on a Digitizer Module will be a data stream of binary numbers that represent the input signal. A data stream is a continuous stream of samples of the input signal that occur at the base sample rate of the A/D converter. It is possible to decimate or interpolate the sample rate at any desired point down stream as long as the physical hardware can support it. The physical configuration of data streams and the allowable data formats are such that a system may be configured for any desired number of interleaved channels, as noted above, multiple streams may co-exist in a single channel. That is, data streams in an SDO channel are conveyed over a number of 16-bit ribbon cables, accompanied by a clock signal. For each data stream, the source is a 16-bit, 12-bit, or an 8-bit A/D converter on a digitizer module. It is also possible to send two 8-bit A/D converter output signals over a single 16-bit data stream cable.

A data stream may also originate from one of the processor modules in a channel. For example, a processor module could operate as an AWG, arbitrary waveform generator for applying its output signal to down stream modules. Moreover, it is envisioned that a processor module can receive data from multiple data streams, perform a mathematical expression operation on them, and output a resultant data stream. As noted above, it is envisioned that the sample clocks travel with the stream. Therefore, if a processor module decimates the sample rate it must also divide down the sample clock to the appropriate rate and pass it to the next board.

A Processor Module is capable of performing measurements on, or applying signal processing algorithms to, the stream of data as it passes from the input to the output of the module. The measurements that it performs may be compared against levels and used as triggers. A processor board may have multiple trigger outputs, and it is herein recognized that Processor Modules may have trigger input signals. These trigger input signals can be used by the Processor Module in various ways that will depend on the library of functions that are created for a particular processor. For example, trigger input signals may act as triggers to arm the Processor Module to make measurements. Some processor boards may be configured using FPGAs and some may use standard DSP chips. However, each will have its own library of trigger sources. The purpose of the Trigger source window menu is to allow the user to select the trigger type that is assigned to the trigger outputs of processor boards.

Figure 15:
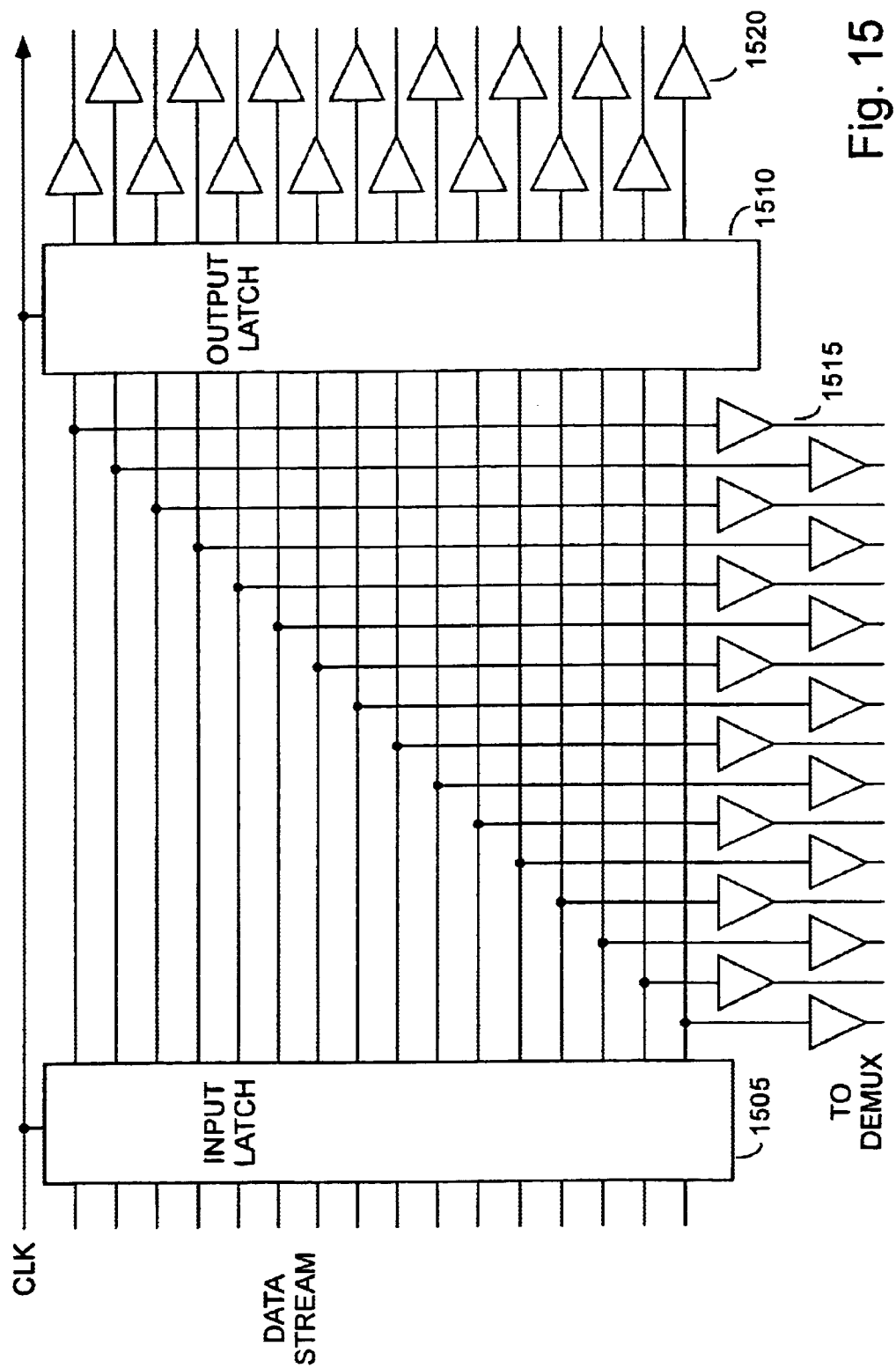
FIG. 15 shows, in simplified block diagram form, the Stream Splitter of the Acquisition Memory Module of FIG. 10.

FIG. 15 is a simplified circuit block diagram of the Stream Splitter 1010 of Acquisition Memory Module 1000 of FIG. 10. In its simplest form, Stream Splitter 1010 comprises a clocked input latch 1505 for receiving at least one data stream, a buffer array 1515 for providing lathed data to Demultiplexer circuit 1020, a clocked output latch 1510, and an output buffer array 1520 for passing the data stream or streams to the next module in the sequence.

The following is a list of parameters that the system controller PC may set and/or read for a memory board. The parameters have been chosen so that the different board models may have different numbers of input streams or triggers or total memory length.

NameString: This parameter is a string that contains the name, model number and serial number of this memory board.

Trigger1 Delay . . . Trigger32 Delay units in seconds . . . This is the time from when a trigger occurred to the time when it will actually be acknowledged by the memory module. This counter has resolution of 1 pSec and a maximum value of 10 seconds. As noed above, a memory module may actually contain anywhere from 1 to 32 trigger inputs. A memory module recognizes two trigger positions. T1 will be the actual instance of the trigger event at the input. T2 will be the position of the delayed trigger. T2 will always occur inside the acquired waveform record. While T1 may or may not occur before the beginning of the acquired waveform record. In absolute time T1=0 and delay=T2. On a waveform display that is fit to a display screen, T2 will always be on the waveform. The value of Vbar cursors positioned at T2 will read out zero. V bar cursors will read out in seconds with respect to T2.

Trigger1 Enable . . . Trigger32 Enable. This variable determines whether a trigger is enabled. When enabled, it will cause a waveform to be acquired in the memory upon the occurrence of a trigger event.

Internal trigger disables: Whenever a trigger is received on any of the 32 trigger input lines, a latch 1035A, 1035B, . . . 1035N on that line will be set. It in turn will disable the latches on all other input trigger lines. The system controller PC can then read this trigger register to determine which trigger input was used to acquire the waveform.

PreTrigger . . . in samples . . . This parameter determines how many samples are acquired before the trigger event. A Trigger Position tab in the oscilloscope menu allows the user to set the preTrigger value either in units of percent of record length, or in units of seconds with respect to T2.)

PostTrigger . . . in samples . . . This determines how many samples are acquired after the trigger event.

ResetAcquisition: If this parameter is equal to 1, all memory control logic is reset to a reset state. This prepares the memory module to begin collecting data once EnableAcquisition is set to 1.

EnableAcquisition: If this parameter is equal to 1 the memory is enabled to begin collecting data samples. If this parameter is reset to 0, then no data is stored in memory as the data stream passes through the board.

Arm . . . This is a read only parameter. It is set to 1 by the internal memory board logic when the required number of pretrigger samples has be stored. It is set to zero when ResetAcquisition is asserted. When armed, the memory module is ready to receive a trigger. Detection of a trigger begins acquisition of samples into the circular memories. When the requested number of post trigger samples has been collected then the EnableAcquisiton parameter is set to zero to stop the data stream from being stored into memory.

ReadWaveform . . . When the waveform samples are requested over the PC interface bus they are read from the memory in sequential order. The module logic reads the samples in unwrapped order.

MemorySize: This is a read only parameter. It tells the system PC what the maximum length of the memory is in units of samples. These samples may be of either type float or 16-bit integer.

MemoryType: This parameter specifies what kind of data is in the memory. Two common kinds of data are integer and floating point.

InterleaveFactor: This parameter specifies interleave factor. The input data streams will be stored in memory in the same order regardless of whether or not interleave is on or off. However, the pre and post trigger numbers must be set accordingly. When data is interleaved and the PC request waveform number 1 the data will be obtained by the PC using addresses that index by one. The memory logic will increment addresses by the interleave factor.

NumberOfInputStreams: This parameter is read only. Its value specifies how many 16-bit input streams are installed on the memory board. The external PC then determines how those data streams will be interpreted by setting the interleave and memoryType parameters.

The number of output streams will always equal the number of input streams.

NumberOfTriggers: This parameter is read only. It specifies how many trigger inputs have been installed on this memory board.

TimeStamp: Each acquired waveform will have a time stamp associated with it. This time stamp may be read from the memory board after a trigger has occurred.

The following describes an abstract interface that is common to all preamplifier modules. This abstract interface ensures that the system controller PC will always have the same set of common commands for controlling a preamplifier, no matter what kind of preamplifier is installed into slot 0 of the channel. All parameters described herein are stored on the preamplifier module. Modules that require additional commands may be built as a subclass of the abstract interface.

nameString: This parameter returns a string that contains the model, serial, and kind of the preamplifier. For example . . . Differential, DA101, SERIAL000032. One serial number exists for the entire module. However, each preamplifier channel will have its own name string and model number.

numberOfChannels. This is a read only parameter. A preamplifier may have any desired number of channels on it. This parameter specifies how many preamplifiers are mounted on the board. These channels will be identical to facilitate mulitway interleave down stream. Different types of amplifier modules can exist in an SDO, however, modules with more than one amplifier will have amplifiers of the same type.

PossibleBw1 . . . possibleBwN: This parameter is an array of bandwidth settings that are possible for each channel. The end of the array is terminated with zero. (All channels on the module board.)

bw1: . . . bwn: This is a parameter, one for each amplifier, that specifies the bandwidth of the channel. The value of the parameter is an index that causes the logic to switch the hardware to the correct setting.

possibleScale1 . . . possibleScaleN: The possibleScale parameter is a read only array of floats that specifies the possible vertical scale settings that may be obtained by the associated preamplifier. Scale factor is specified in terms of gain regardless of what the input units are. This gain is vout/vin of the amplifier. The SDO may determine volts-per-division by reading the digitizer board parameter called inputRange and computing volts-per-division based upon the number of divisions that have been selected. A value of zero must be placed at the end of the array so that external software can identify the end of the array.

scale1 . . . scaleN: This parameter receives an index value that selects one of the N scales settings that are available. This is an index into the array of possibleScaleN.

preampUnits1 . . . preampUnitsN The inputs to preamplifiers will support the standard Tektronix probe interfaces. Units for the probe may be read out from the module by reading the preampUnitsN parameter.

One skilled in the art will realize that other parameters, for example, for calibration or for other use, may also be added to this list, even though they are not explicitly mentioned. The following describes the abstract interface parameters that reside on the Digitizer module that contains the A/D converters and track and hold ICs for the SDO. This format is specified for standard types of flash A/D converters.

nameString: This parameter contains a name, the model number and the serial number for this digitizer board.

BaseSampleRate: This is a read only parameter that specifies the base sample rate of the digitizer modules. NOTE: All digitizers on a module will operate at the same sample rate. However, an SDO may contain multiple digitizer modules. If desired, different digitizer modules may operate at different base sample rates within an SDO system.

digitizer modules will receive input signals from a preamplifier module board.

digitizer modules will have a synchronizer input on the back side of the module accessible from the back panel of the scope. This will cause the phase lock loop that generates the sample clock to synchronize with respect to edges in this input.

sampleClock: This parameter specifies the sample clock source. It may be set to internal or external.

numberOfDigitizers: This parameter is read only and specifies how many A/D converters are on the module. The number of digitizers is typically a power of two.

interleaveFactor: This parameter sets the board up for multiway interleave. The logic for proper setting of the track and hold IC is contained on the board. The external PC simply loads the interleavefactor parameter with desired settings. Therefore output streams from the board may represent 1, 2, 4, 8, or 16 way interleave.

dig1Skew1Way . . . digNSkew1Way: These parameters contain DAC values for setting the digitizers up for the various ways of interleaving. These must be calibrated. They are then downloaded from the system controller PC for the user-selected setup.

The following abstract interface implements a DPO mode style display. Ideally this display would be designed such that all data samples in the input stream are stored into the bit map memory. There are various ways that this DPO module might potentially be defined. However, initially assume the following implementation.

All data samples in the input stream are stored into the bit map when it operates in XY continuous mode. In triggered YT mode the memory would have very small dead times between triggers. The system will be specified to have an optional analog video output signal. This would only be able to operate at sample rates that are slow enough to allow input samples to be written continuously while simultaneously generating a raster scan output of the memory to create the video therefrom. This video may then be switched into the system display as needed.

A roll mode abstract module will have the capabilities of creating a video output signal that is synchronized to other video signals in the system. This video display would be designed to view all samples in the stream as they occur. This mode is only valid for streams of sufficiently low sample rate for the human eye to obtain usable information from the display.

A hard disk drive abstract interface defines parameters for a hard disk drive card that is capable of receiving data streams as an input and passing them to the next module. It is also capable of storing all samples of the stream into a disk drive file when a trigger input is received, as long as the sample rate is low enough. If the sample rate goes too high, data is missed, and an LED on the board lights. This overflow signal is available for the system software to read as well.

The disk drive abstract interface has the following characteristics: It has trigger inputs that are similar to an acquisition memory module. Each trigger input has a delay counter. There are no pretrigger samples. It does not write data into a circular buffer to allow for pretrigger. Data write-to-file operations will begin at the instant one of the enabled input triggers is activated. A disk drive board has a microcontroller to translate system interface commands to the machine level register and bits that need to be controlled.

Selected channels can have all of their controls and parameters ganged so that adjusting a parameter will affect all the selected channels. Only channels with identical hardware configuration are eligible to be locked together. The fact that various channels can have their vertical controls ganged is a key feature of an SDO system. The user can gang groups of controls in any desired combination, and in any number of combinations.

A timebase menu (not shown) is more difficult to deal with because different channels may have multiple settings for sample rate and record length. Only channels with identical hardware configuration are eligible to be locked together.

A timebase is the combination of a decimator on a processor board and an acqusition memory module. It depends on what modules are present in the stream and in what order they are connected. For example, if there were a decimator followed by an Acquisition Memory Module, then the timebase controls for both modules would appear in this menu.

If there were a first decimator and a first memory and a second decimator and a second memory then there would be two timebases and there would be two timebase menu tabs that could be selected for one channel.

If there were a memory followed by a decimator then there would be two timebase tabs. Menu items pertaining to sample rate for the Acquisition Memory Module would be grayed out. Likewise, for the second timebase, menu items pertaining to record length would be grayed out.

The rule is to search down stream starting at a preamp module to determine how many timebases there are in the data stream. A menu tab is built for each timebase that is present.

Only identical channels may be ganged with the Selected Channels Menu. The selected channels menu settings will be remembered as the user switches from one tab to another.

Adjusting sample rate may cause the interleaving to go into effect only if the additional channels needed to interleave are not in the ON state.

Perhaps the most outstanding aspect of this architecture is that both the hardware and software components are object-oriented. This means that the real time software of the system is composed of objects that "see" a hardware interface that does not change unless a new behavior is added to a subclass; only the configuration of hardware objects on the interface changes.

The SDO software architecture is strictly object oriented. The software objects are distributed throughout the system. For example, each module has a local microcontroller that is capable of implementing the abstract software interface local to that module. This distributed approach means that a new board can be designed and any changes to the boards logic design or configuration are handled by the local on board SW. The main system processor will still talk to the board through the standard abstract interface that is valid for all boards of that type. (Types of boards are digitizer, preamplifiers, memories, D/A converters, etc.) If a board does need to add new functionality to the interface then a subclass object would be created. This would inherit the original abstract class behavior and add the new behavior. This case would require minimal main system firmware modifications. For example, because a digitizer module has a fixed abstract interface it is possible to plug-in a board with two digitizers or a board with 16 digitizers and the system controller PC processor software will not "see" any difference in communication with the board. It will just know that the current version of the board will have more or less resources then other versions of the board by queries to the abstract interface.

The end result of distributing the software class objects throughout the system is that each time a new system module is designed, the software effort will be a very small effort that is localized to the module itself. This will result in shorter engineering cycles in order to upgrade or modify parts of an SDO system. This will result in faster times to market and lower engineering development costs. It makes the overall system easier to maintain because a small team can make localized changes to the on-board software of the module, as opposed to a many person team required to make changes to software architecture for the main system.

It is herein recognized that an SDO system can be embedded into a customer's test and measurement system. An SDO is capable of real time signal processing and generation of analog signals. Such signals can be derived from a user input signal, or they can be internally-generated, for example, by an Arbitrary Waveform Generator (AWG).

What is claimed is:

1. A test and measurement instrument, comprising:
   a preamplifier module for receiving and amplifying an analog signal to be measured;
   a digitizer module for generating a stream of binary data representative of samples of said analog signal;
   a processor module for receiving said binary data and generating a trigger signal in response thereto, said processor module being capable of generating multiple trigger signals based upon different trigger criteria for different portions of said binary data stream;
   an acquisition memory module for receiving said stream of binary data, and receiving said trigger signal, and storing at least a portion of said binary data in response to said trigger signal;
   said preamplifier module, said digitizer module, said processor module, and said acquisition memory module being individually pluggable to, and unpluggable from, said test and measurement instrument;
   said preamplifier module, said digitizer module, said processor module, and said acquisition memory module forming a channel; and
   a ribbon cable coupled between said digitizer board, said processor module and said acquisition memory module for conveying said binary data stream in said channel.

2. The test and measurement instrument of claim 1, wherein:
   a waveform is defined by a trigger signal applied to an acquisition memory module.

3. The test and measurement instrument of claim 2, wherein:
   a timebase within a channel is defined by a module employing a decimator being followed by an acquisition memory module.

4. A test and measurement instrument, comprising:
   a preamplifier module for receiving and amplifying an analog signal to be measured;
   a digitizer module for generating a stream of binary data representative of samples of said analog signal;
   a first processor module for receiving said binary data and generating a first trigger signal in response thereto;
   a first acquisition memory module for receiving said stream of binary data, and receiving said first trigger signal, and storing at least a portion of said binary data in response to said first trigger signal;
   a second processor module for receiving said stream of binary data and generating a second trigger signal based upon different trigger criteria than said first trigger signal;
   a second acquisition memory module for receiving said stream of binary data, and receiving said second trigger signal, and storing at least a second portion of said binary data stream in response to said second trigger signal;
   said preamplifier module, said digitizer module, said first and second processor modules, and said first and second acquisition memory modules forming a single channel; and
   a ribbon cable coupled between said digitizer board, said processor modules and said acquisition memory modules for conveying said binary data stream in said channel.

5. The test and measurement instrument of claim 4, wherein:
   a first waveform is defined by said first trigger signal being applied to said first acquisition memory module, and a second waveform is defined by said second trigger signal being applied to said second acquisition memory module.

6. The test and measurement instrument of claim 5, wherein:
   a timebase within a channel is defined by a module employing a decimator being followed by an acquisition memory module.

7. A Streaming Distributed Oscilloscope, comprising:
   a preamplifier module for receiving and amplifying an analog signal to be measured;
   a digitizer module for generating a stream of binary data representative of samples of said analog signal;
   a first processor module for receiving said binary data and generating a first trigger signal in response thereto;
   a first acquisition memory module for receiving said stream of binary data, and receiving said first trigger signal, and storing at least a portion of said binary data in response to said first trigger signal;
   a second processor module for receiving said stream of binary data and generating a second trigger signal based upon different trigger criteria than said first trigger signal;
   a second acquisition memory module for receiving said stream of binary data, and receiving said second trigger signal, and storing at least a second portion of said binary data stream in response to said second trigger signal;
   said preamplifier module, paid digitizer module, said first and second processor modules, and said first and second acquisition memory modules forming a single channel;
   said preamplifier module, paid digitizer module, said first and second processor modules, and said first and second acquisition memory modules being individually pluggable to, and unpluggable from, said test and measurement instrument;
   a ribbon cable coupled between said digitizer module, said processor modules and said acquisition memory modules for conveying said binary data stream in said channel; and
   a serial digital optical fiber channel for data communication with a system controller processor.

8. The Streaming Distributed Oscilloscope of claim 7, wherein:
   a first waveform is defined by said first trigger signal being applied to said first acquisition memory module, and a second waveform is defined by said second trigger signal being applied to said second acquisition memory module.

9. The Streaming Distributed Oscilloscope of claim 8, wherein:
   a timebase within a channel is defined by a module employing a decimator being followed by an acquisition memory module.

10. A test and measurement instrument, comprising:
a preamplifier module for receiving and amplifying an analog signal to be measured; a digitizer module for generating a stream of binary data representative of samples of said analog signal;
a processor module for receiving said binary data and generating a trigger signal in response thereto, said processor module being capable of generating multiple trigger signals based upon different trigger criteria for different portions of said binary data stream;
an acquisition memory module for receiving said stream of binary data, and receiving said trigger signal, and storing at least a portion of said binary data in response to said trigger signal;
said preamplifier module, said digitizer module, said processor module, and acquisition memory module forming a channel; and
a ribbon cable coupled between said digitizer board, said processor module and said acquisition memory module for conveying said binary data stream in said channel;
wherein:
a waveform is defined by a trigger signal applied to an acquisition memory module;
a timebase within a channel is defined by a module employing a decimator being followed by an acquisition memory module; and
a channel includes more than one timebase.

11. A test and measurement instrument, comprising:
a preamplifier module for receiving and amplifying an analog signal to be measured;
a digitizer module for generating a stream of binary data representative of samples of said analog signal;
a first processor module for receiving said binary data and generating a first trigger signal in response thereto;
a first acquisition memory module for receiving said stream of binary data, and receiving said first trigger signal, and storing at least a portion of said binary data in response to said first trigger sign;
a second processor module for receiving said stream of binary data and generating a second trigger signal based upon different trigger criteria than said first trigger signal;
a second acquisition memory module for receiving said stream of binary data, and receiving said second trigger signal, and storing at least a second portion of said binary data stream in response to said second trigger signal;
said preamplifier module, said digitizer module, said first and second processor modules, and said first and second acquisition memory modules forming a single channel; and
a ribbon cable coupled between said digitizer board, said processor modules and said acquisition memory modules for conveying said binary data stream in said channel;
wherein
a first waveform is defined by said first trigger signal being applied to said first acquisition memory module, and a second waveform is defined by said second trigger signal being applied to said second acquisition memory module;
a timebase within a channel is defined by a module employing a decimator being followed by an acquisition memory module; and
wherein
a channel includes more than one timebase.

12. The test and measurement instrument of claim 9 wherein an architecture of said test and measurement instrument is reconfigurable by a user.

13. A Streaming Distributed Oscilloscope, comprising:
a preamplifier module for receiving and amplifying an analog signal to be measured;
a digitizer module for generating a stream of binary data representative of samples of said analog signal;
a first processor module for receiving said binary data and generating a first trigger signal in response thereto;
a first acquisition memoy module for receiving said stream of binary data, and receiving said first trigger signal, and storing at least a portion of said binary data in response to said first trigger signal;
a second processor module for receiving said stream of binary data and generating a second trigger signal based upon different trigger criteria than said first trigger signal;
a second acquisition memory module for receiving said stream of binary data, and receiving said second trigger signal, and storing at least a second portion of said binary data stream in response to said second trigger signal;
said preamplifier module, said digitizer module, said first and second processor modules, and said first and second acquisition memory modules forming a single channel;
a ribbon cable coupled between said digitizer board, said processor modules and said acquisition memory modules for conveying said binary data stream in said channel; and
a serial digital optical fiber channel for data communication with a system controller processor;
a first waveform is defined by said first trigger signal being applied to said first acquisition memory module, and a second waveform is defined by said second trigger signal being applied to said second acquisition memory module;
a timebase within a channel is defined by a module employing a decimator being followed by an acquisition memory module; and
wherein
a channel includes more than one timebase.

14. The Streaming Distributed Oscilloscope of claim 13 wherein an architecture of said test and measurement instrument is reconfigurable by a user.

15. The Streaming Distributed Oscilloscope of claim 14, wherein
said Streaming Distributed Oscilloscope comprises a master unit, and a slave unit, and a configuration of modules in said slave unit is alterable from said master unit by a user.

16. A test and measurement instrument, comprising:
a preamplifier module for receiving and amplifying an analog signal to be measured; a digitizer module for generating a stream of binary data representative of samples of said analog signal;
a processor module for receiving said binary data and generating a trigger signal in response thereto, said processor module being capable of generating multiple trigger signals based upon different trigger criteria for different portions of said binary data stream;

an acquisition memory module for receiving said stream of binary data, and receiving said trigger signal, and storing at least a portion of said binary data in response to said trigger signal;

said preamplifier module, said digitizer module, said processor module, and acquisition memory module forming a channel; and a ribbon cable coupled between said digitizer board, said processor module and said acquisition memory module for conveying said binary data stream in said channel;

wherein:
a waveform is defined by a trigger signal applied to an acquisition memory module;
a timebase within a channel is defined by a module employing a decimator being followed by an acquisition memory module; and wherein
an architecture of said test and measurement instrument is reconfigurable by a user.

* * * * *